US006642757B2

(12) United States Patent
Ikehashi et al.

(10) Patent No.: US 6,642,757 B2
(45) Date of Patent: Nov. 4, 2003

(54) SEMICONDUCTOR MEMORY DEVICE HAVING A POWER-ON RESET CIRCUIT

(75) Inventors: Tamio Ikehashi, Kamakura (JP); Kazushige Kanda, Kawasaki (JP)

(73) Assignee: Kabushiki Kaisha Toshiba, Minato-Ku (JP)

(*) Notice: Subject to any disclaimer, the term of this patent is extended or adjusted under 35 U.S.C. 154(b) by 0 days.

(21) Appl. No.: 09/957,027

(22) Filed: Sep. 21, 2001

(65) Prior Publication Data

US 2002/0033720 A1 Mar. 21, 2002

(30) Foreign Application Priority Data

Sep. 21, 2000 (JP) ........................................ 2000-287498
Nov. 21, 2000 (JP) ........................................ 2000-354640

(51) Int. Cl.[7] .............................................. H03L 7/00
(52) U.S. Cl. ........................................ 327/143; 327/142
(58) Field of Search ............................... 327/143, 142, 327/536, 537, 538, 198; 365/189.11, 189.6, 189.7; 331/57

(56) References Cited

U.S. PATENT DOCUMENTS

| | | | | |
|---|---|---|---|---|
| 5,805,509 A | * | 9/1998 | Leung et al. | 327/534 |
| 5,912,575 A | * | 6/1999 | Takikawa | 327/156 |
| 6,205,079 B1 | * | 3/2001 | Namekawa | 327/536 |
| 2001/0017566 A1 | * | 8/2001 | Akihiro | 327/536 |

FOREIGN PATENT DOCUMENTS

| | | |
|---|---|---|
| JP | 02-228064 | 9/1990 |
| JP | 2001-184882 | 7/2001 |

OTHER PUBLICATIONS

H. Tanaka et al., "A Precise On–Chip Voltage Generator for a Gigascale DRAM with a Negative Word–Line Scheme", IEEE Journal of Solid–State Circuits, vol. 34, No. 8, Aug. 1999, pp. 1084–1090.

* cited by examiner

*Primary Examiner*—Timothy P. Callahan
*Assistant Examiner*—Linh Nguyen
(74) *Attorney, Agent, or Firm*—Banner & Witcoff, Ltd.

(57) ABSTRACT

A semiconductor device includes an internal power supply terminal for supplying an internal power supply voltage, an oscillator generating a clock pulse when the internal power supply voltage becomes higher than a first voltage, a charge pump circuit charge pumping upon receiving the clock pulse, a reference voltage generator using the output voltage from the charge pump circuit as a power supply, and a voltage monitor which uses the output voltage from the charge pump circuit as a power supply, has a comparator for comparing a divided voltage of the internal power supply voltage with the reference voltage, and outputs a first signal of a first logic level as the power-on reset signal when the internal power supply voltage is higher than a second voltage. With this arrangement, a power-on reset circuit with little variation in power-on monitoring level can be provided.

18 Claims, 28 Drawing Sheets

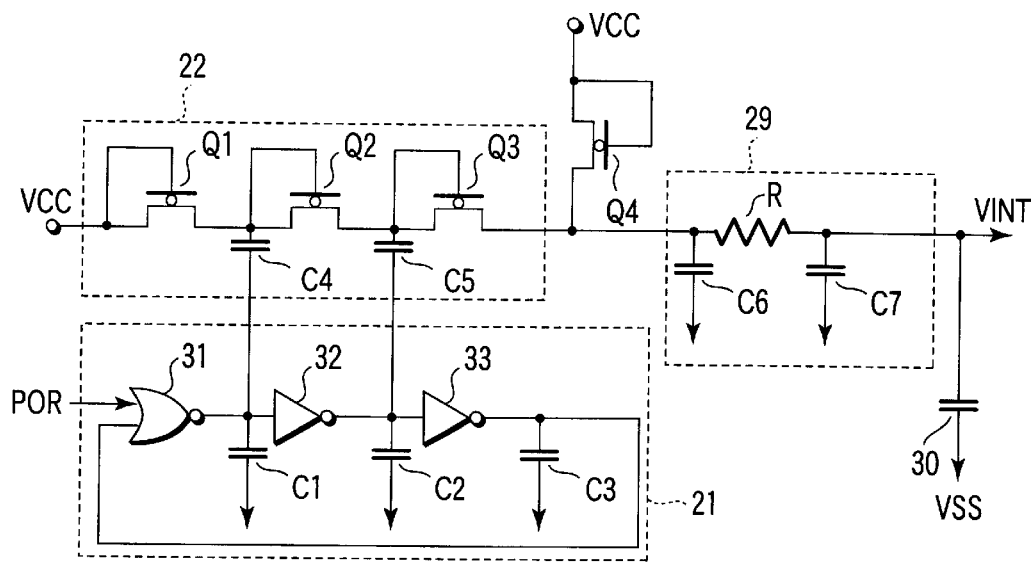
F I G. 4
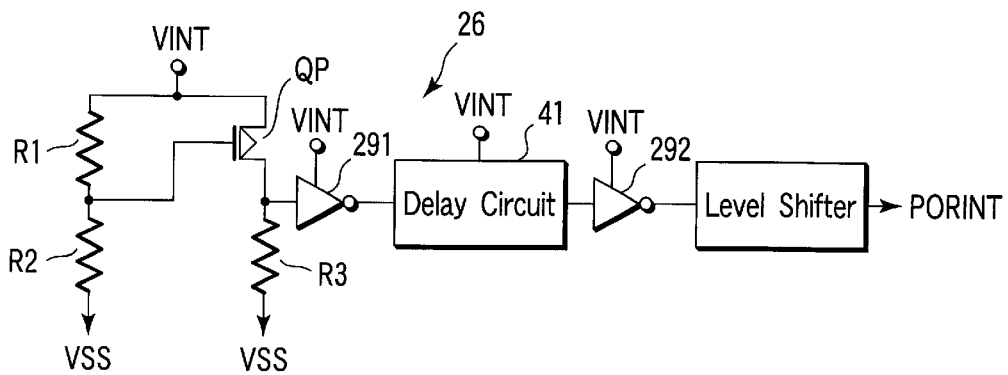
F I G. 5
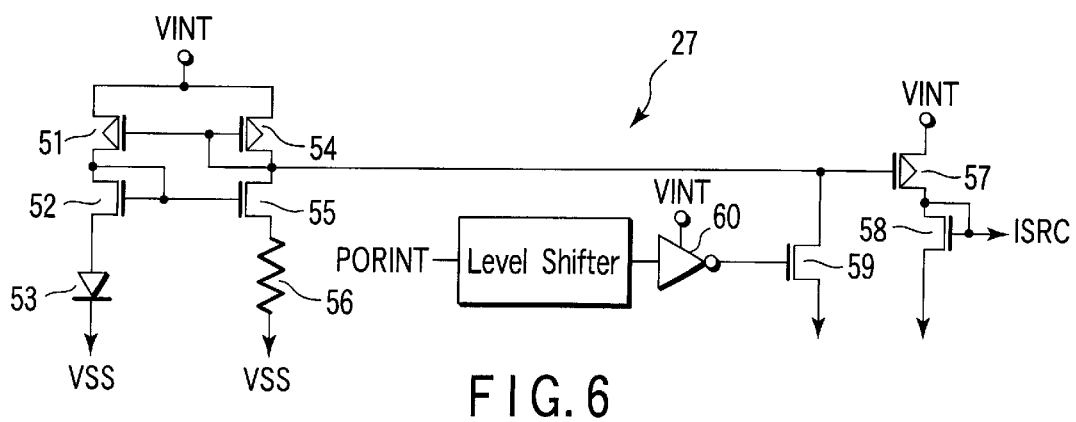
F I G. 6

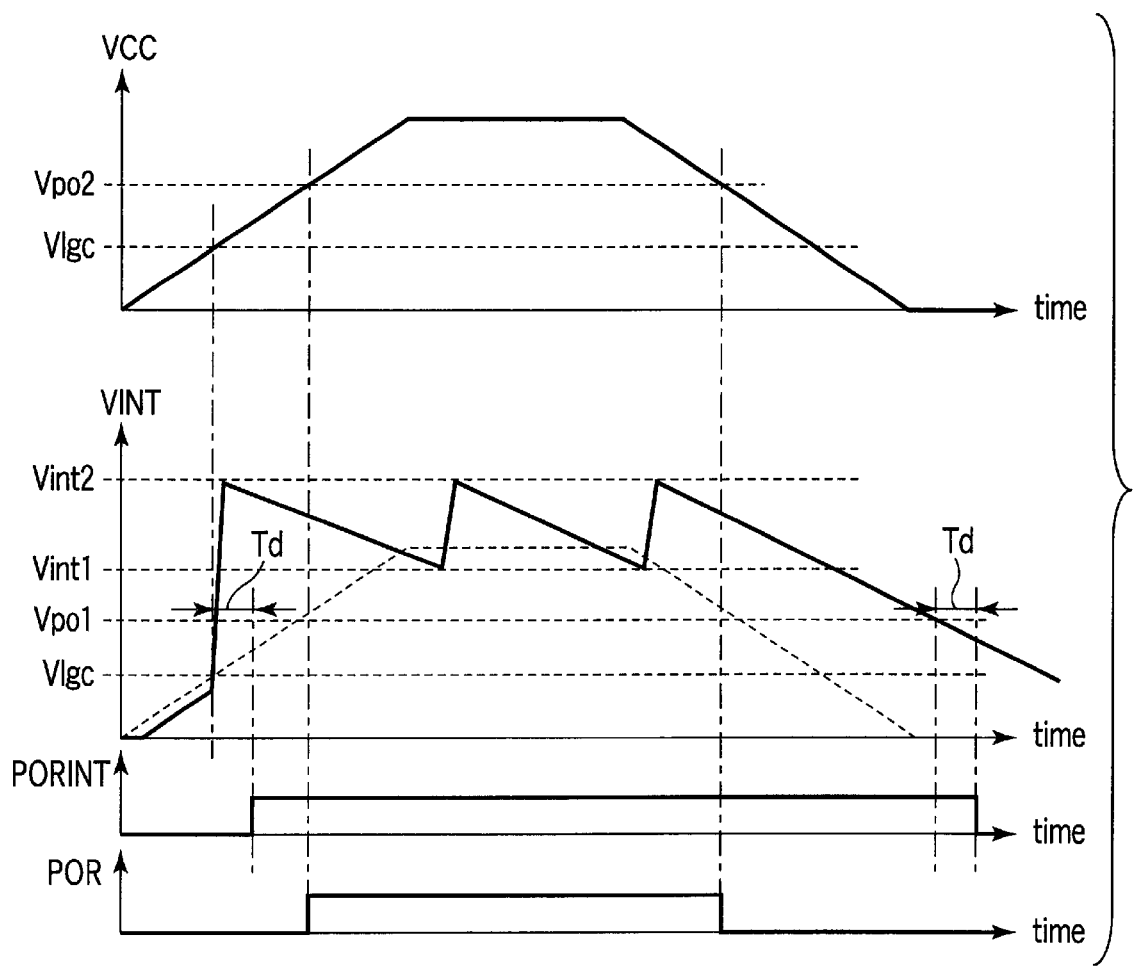
F I G. 16

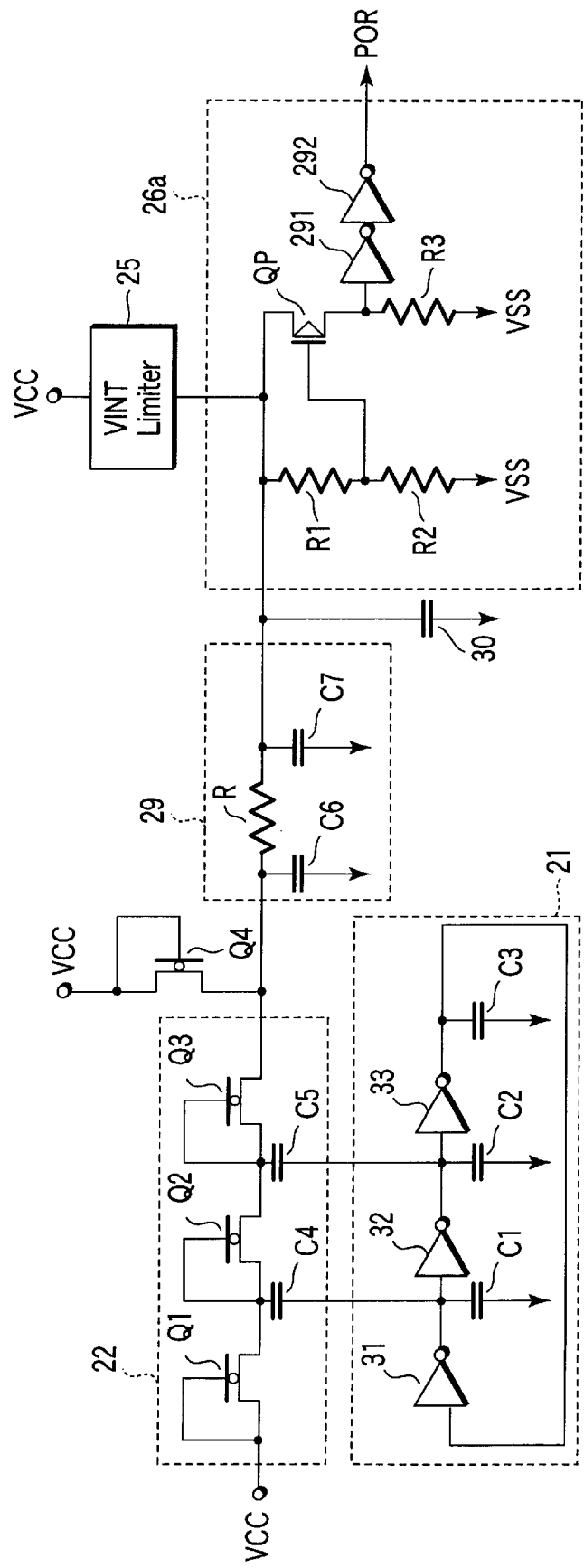
F I G. 21

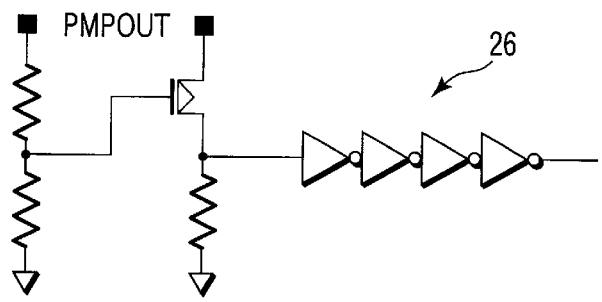
F I G. 27
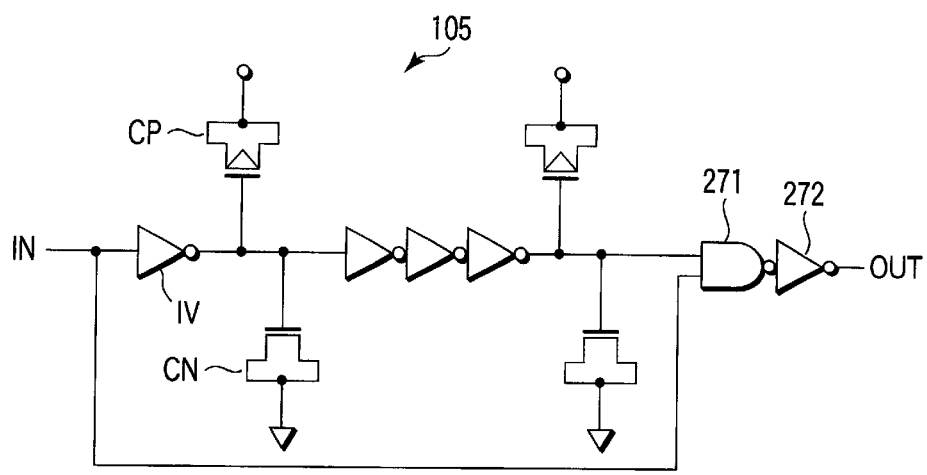
F I G. 28
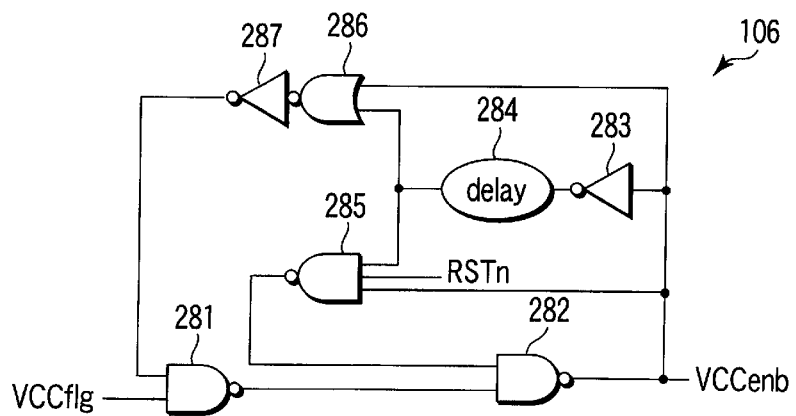
F I G. 29

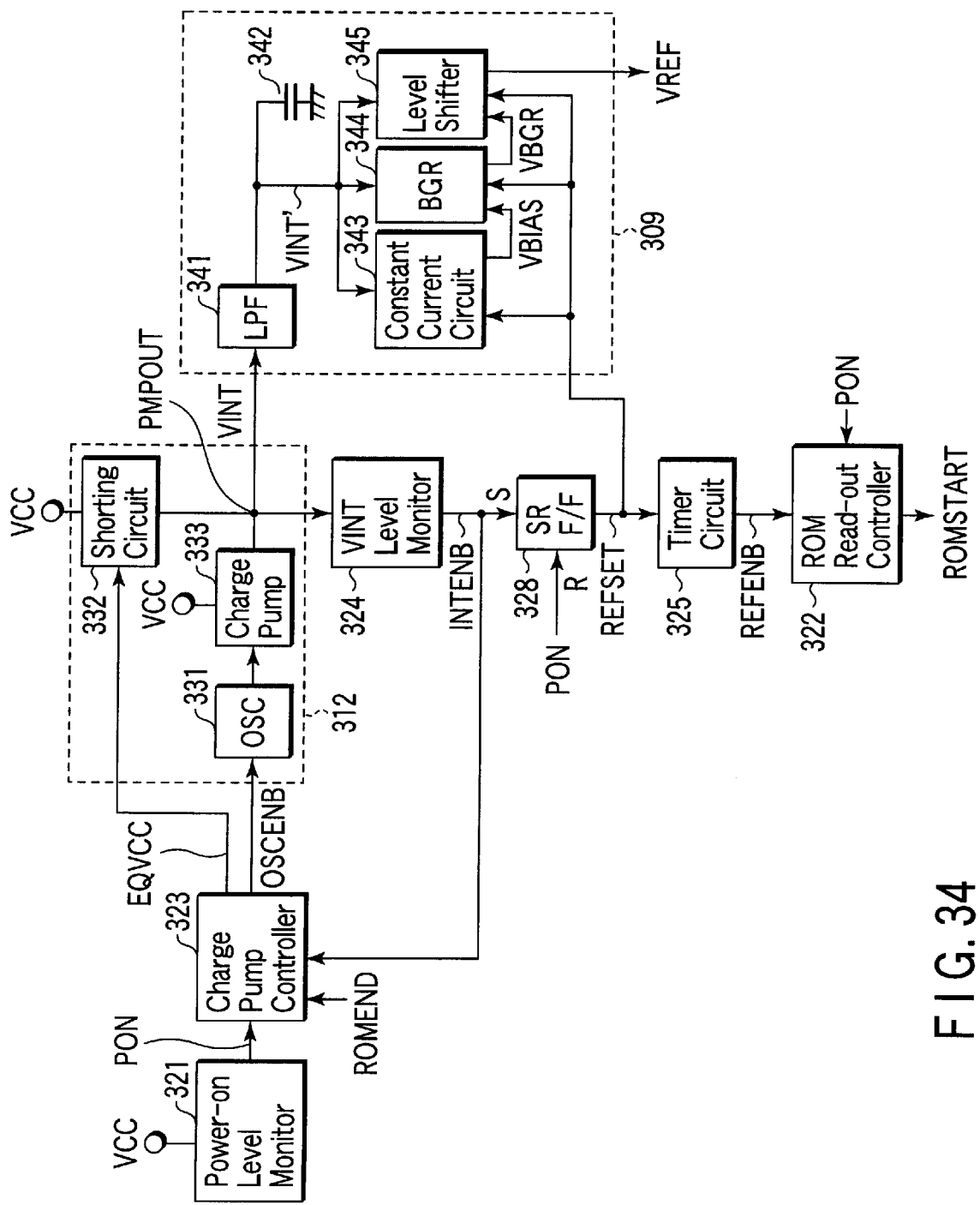
F I G. 34

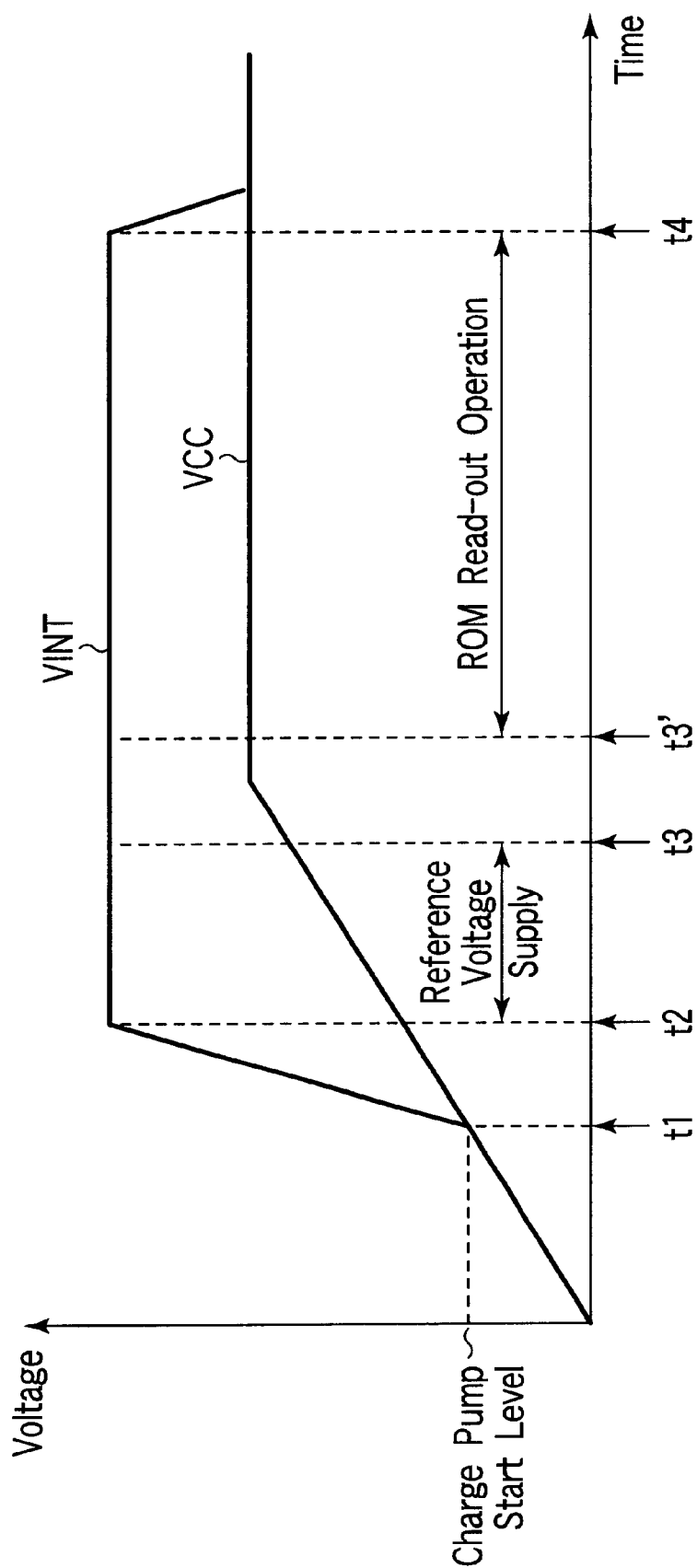
F I G. 39

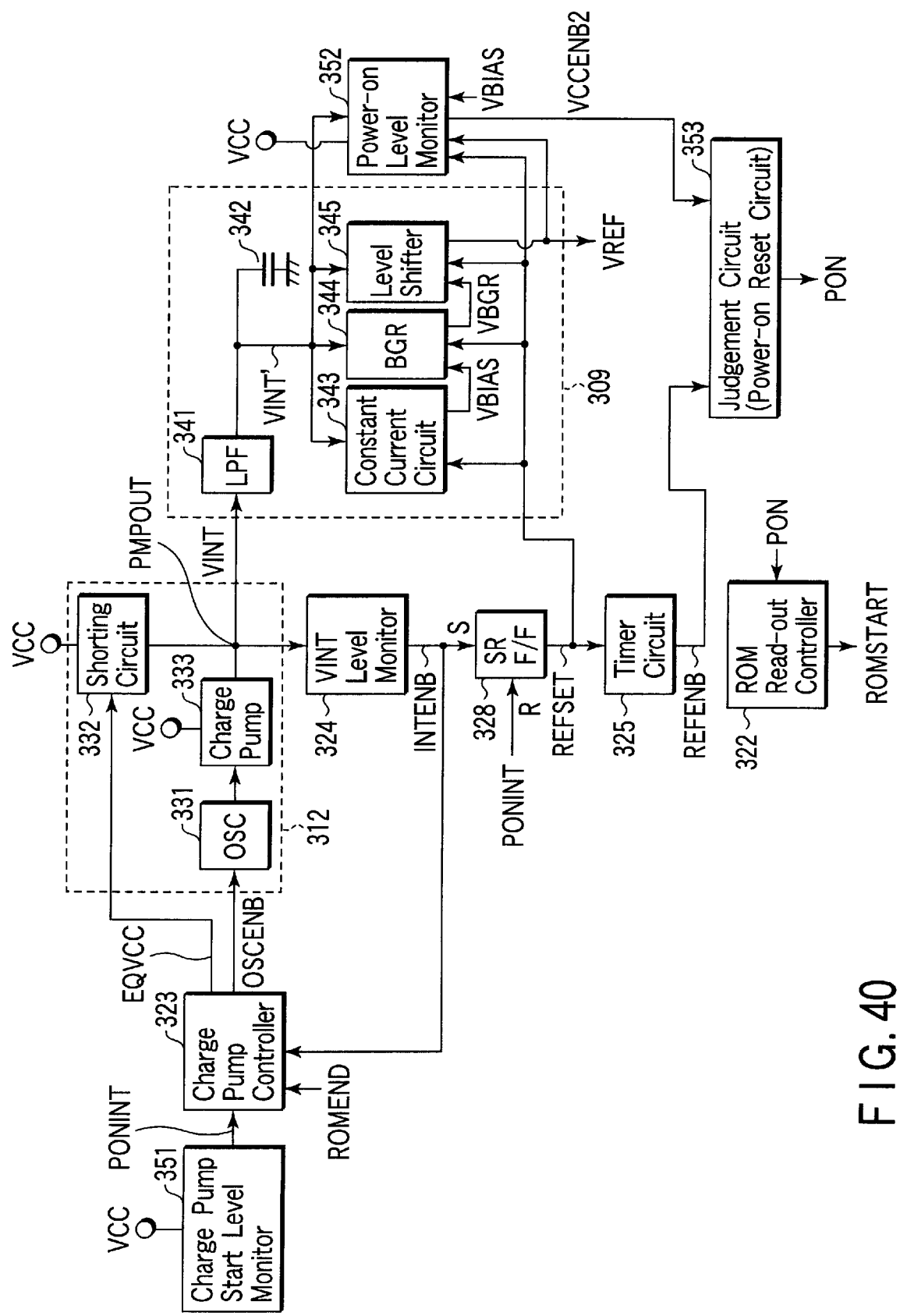
F I G. 40

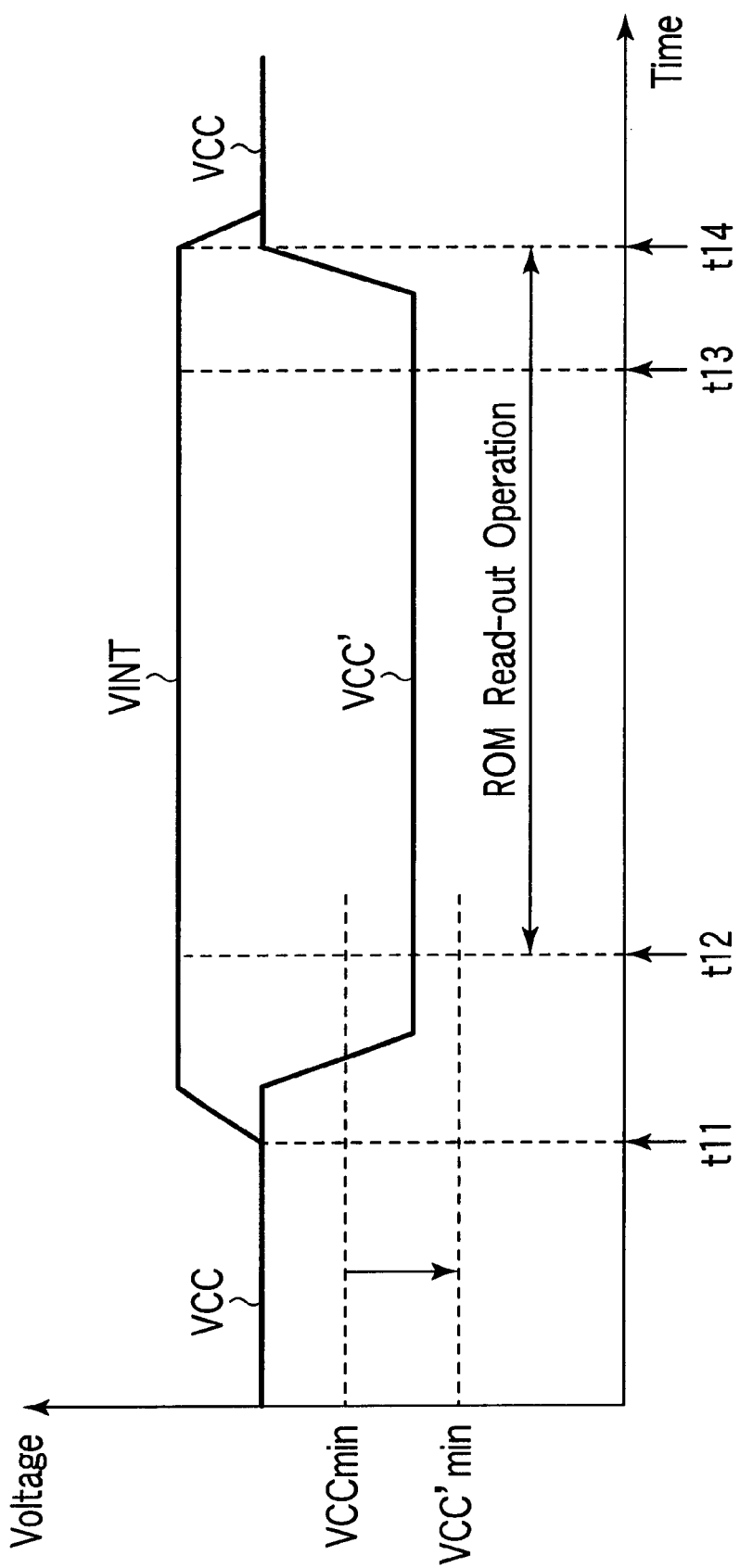
F I G. 43

SEMICONDUCTOR MEMORY DEVICE HAVING A POWER-ON RESET CIRCUIT

CROSS-REFERENCE TO RELATED APPLICATIONS

This application is based upon and claims the benefit of priority from the prior Japanese Patent Applications No. 2000-287498, filed Sep. 21, 2000; and No. 2000-354640, filed Nov. 21, 2000, the entire contents of both of which are incorporated herein by reference.

BACKGROUND OF THE INVENTION

1. Field of the Invention

The present invention relates to a semiconductor device and, more particularly, to a power-on reset circuit which is used for, e.g., a semiconductor memory.

2. Description of the Related Art

A power-on reset circuit generates a power-on reset signal when an externally input power supply voltage reaches a predetermined value or more. A power-on reset signal is also used to initialize the state of a flip-flop circuit in a semiconductor chip or initialize an analog circuit such as a constant current generator or reference voltage generator.

In a semiconductor memory, for example, let VCC be the power supply voltage, Vlgc be the power supply voltage at which logic circuits such as flip-flops start operating, Valg be the power supply voltage at which analog circuits start operating, and VCCmin be the lower limit of the power supply voltage VCC determined from specifications. In this case, a power-on monitoring level Vpo which is the value of the power supply voltage VCC at which the power-on reset signal changes from "L" to "H" must satisfy $$\max(\text{Vlgc}, \text{Valg}) < \text{Vpo} < \text{VCCmin} \quad (1)$$

where max(Vlgc,Valg) indicates a larger one of the power supply voltages Vlgc and Valg. Normally, the power supply voltage Valg is larger.

FIG. 1A shows the arrangement of a conventional power-on reset circuit. This power-on reset circuit has the following arrangement.

Two resistive elements R1 and R2 are connected in series between a VCC node to which an externally input power supply voltage VCC is supplied and a VSS node to which a ground potential VSS is supplied. The gate of a PMOS transistor QP is connected to a series-connection node A between the resistive elements R1 and R2. The source of the PMOS transistor QP is connected to the VCC node. A resistive element R3 is connected between the VSS node and the drain of the PMOS transistor QP.

The potential of a series-connection node B between the resistive element R3 and the drain of the PMOS transistor QP is input to two inverters 291 and 292 which use the power supply voltage VCC as the operation power supply. The output from the latter inverter 292 is used as a power-on reset signal POR.

The operation of the power-on reset circuit with the above arrangement will be described. The threshold value of the PMOS transistor QP is represented by Vtp. Immediately after the power supply voltage VCC is supplied, the PMOS transistor QP is kept OFF, the potential of the node B is kept at "L", and the output potential of the latter inverter 292 is kept at "L".

As shown in FIG. 1B, when the power supply voltage VCC rises and exceeds the power-on monitoring level Vpo=(R1+R2)|Vtp|/R1 at time t1, the PMOS transistor QP in FIG. 1A is turned on. As the potential of the node B changes to "H", and the power-on reset signal POR changes to "H", the power-on reset signal POR is generated. The resistance value ratio between the resistive elements R1 and R2 is determined such that relation (1) is satisfied.

In the conventional power-on reset circuit as described above, the power-on monitoring level Vpo depends on the threshold value Vtp of the PMOS transistor QP. The threshold value Vtp of the PMOS transistor QP has a variation based on the manufacturing process and also changes depending on the temperature. For this reason, the power-on monitoring level Vpo also largely changes due to the variation in threshold value Vtp of the PMOS transistor QP or the temperature, and the condition (1) is not satisfied. A range indicated by arrows in FIG. 1B shows the variation in power-on monitoring level Vpo due to the variation in threshold value Vtp of the PMOS transistor QP or the temperature. FIG. 1B shows a state wherein the relation (1) is satisfied.

In a semiconductor memory having a capacity as large as 1 Gbit, to realize low VCC operation by employing a ROM fuse as a fuse element, various power supply voltages and the read-out operation of the ROM fuse at the power-on time must be taken into consideration. For example, if 2.3-V operation on the specifications and 2.1-V operation on the design are to be guaranteed, -1.6-V operation must be guaranteed in the power-on reset circuit. However, use of such a low power supply voltage is basically impossible because a Wilson circuit or differential amplifier as a current source circuit does not operate.

As described above, in the conventional power-on reset circuit, the power-on monitoring level Vpo depends on the threshold value Vtp of the PMOS transistor QP, and the threshold value Vtp has a variation based on the manufacturing process and also changes depending on the temperature. For this reason, the power-on monitoring level Vpo also largely changes due to the variation in threshold value Vtp of the PMOS transistor QP or the temperature, and the normal operation condition is not satisfied.

Hence, implementation of a semiconductor device having a power-on reset circuit whose power-on monitoring level changes little due to a variation in threshold value of an element used or the temperature is required.

In addition, implementation of a semiconductor device which can operate a Wilson circuit or reference voltage generator as a current source circuit even when a low power supply voltage is used is desired.

Furthermore, implementation of a semiconductor memory device capable of stable read-out operation even when the power supply voltage is dropped in normal read-out operation is desired.

BRIEF SUMMARY OF THE INVENTION

According to the first aspect of the present invention, there is provided a semiconductor device comprising:
   an oscillator which starts generating a clock pulse when an externally supplied power supply voltage becomes higher than a first voltage;
   a charge pump circuit configured to execute charge pumping operation upon receiving the clock pulse; and
   a voltage monitor configured to generate a power-on reset signal upon receiving an output voltage from the charge pump circuit.

According to the second aspect of the present invention, there is provided a semiconductor memory device comprising:

a memory cell array in which a plurality of memory cells are arranged;

a register configured to store data read out from the plurality of memory cells;

a reference voltage circuit configured to generate a reference voltage; and a charge pump circuit configured to charge-pump a power supply voltage for the reference voltage circuit during a period of a read-out operation when the data are read out from the plurality of memory cells.

BRIEF DESCRIPTION OF THE SEVERAL VIEWS OF THE DRAWING

FIG. 1B is a waveform chart showing the relationship of various kinds of voltages at the time of power-on;

FIG. 4 is a circuit diagram showing the oscillator, charge pump circuit, low-pass filter, and stabilizing capacitor shown in FIG. 3;

FIG. 5 is a circuit diagram showing the VINT monitor in FIG. 3;

FIG. 6 is a circuit diagram showing the current source generator in FIG. 3;

FIG. 16 is a timing chart for explaining the operation of the POR signal generator shown in FIG. 14;

FIG. 21 is a block diagram showing the fifth example of the POR signal generator;

FIG. 27 is a circuit diagram showing the VINT monitor in FIG. 22;

FIG. 28 is a circuit diagram showing the delay circuit (BGR stabilization judgment circuit) in FIG. 22;

FIG. 29 is a circuit diagram showing the flag fixing circuit in FIG. 22;

FIG. 34 is a block diagram showing the power supply system of the nonvolatile semiconductor memory device which executes the operation shown in FIG. 33;

FIG. 39 is a timing chart showing the operation of the nonvolatile semiconductor memory device according to the fifth embodiment;

FIG. 40 is a block diagram showing the power supply system of the nonvolatile semiconductor memory device which executes the operation shown in FIG. 39;

FIG. 43 is a timing chart showing the operation of the nonvolatile semiconductor memory device according to the seventh embodiment.

DETAILED DESCRIPTION OF THE INVENTION

The embodiments of the present invention will be described below with reference to the accompanying drawing.

(First Embodiment)

Figure 2:
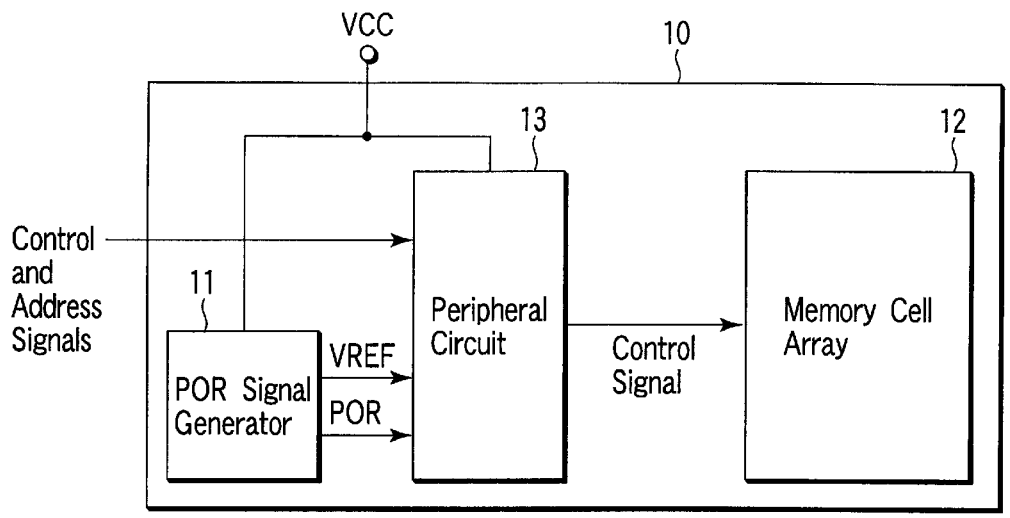
FIG. 2 is a block diagram schematically showing the arrangement of a semiconductor memory according to the first embodiment.

FIG. 2 schematically shows the arrangement of a semiconductor memory according to the first embodiment of the present invention.

Referring to FIG. 2, a power supply voltage VCC and control and address signals are externally input to a memory chip 10. In the chip, a POR signal generator (power-on reset circuit) 11, memory cell array 12, and peripheral circuit 13 for controlling the memory cell array 12 are arranged. The POR signal generator 11 receives the power supply voltage VCC and generates a reference voltage VREF and power-on reset signal POR. The peripheral circuit 13 receives the control and address signals and also the reference voltage VREF and power-on reset signal POR.

<First Example of POR Signal Generator>

Figure 3:
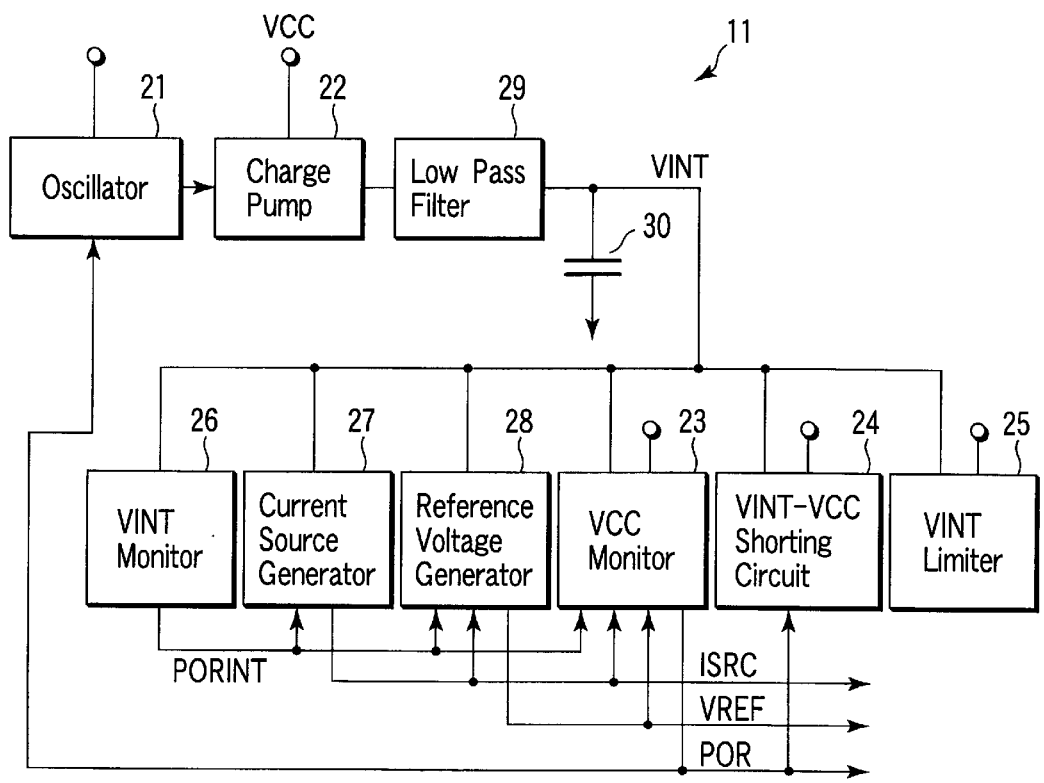
FIG. 3 is a block diagram showing the first example of the POR signal generator in FIG. 2.

FIG. 3 is a block diagram showing the first example of the POR signal generator 11 in FIG. 2.

This POR signal generator includes circuits using the power supply voltage VCC as a power supply and circuits using a charge-pumped voltage VINT charge-pumped from the power supply voltage VCC as a power supply.

An oscillator 21, charge pump circuit 22, VCC monitor 23, VINT-VCC shorting circuit 24, and VINT limiter 25 use the power supply voltage VCC as a power supply. In this example, a low-pass filter 29 and charge-pumped voltage stabilizing capacitor 30 are inserted to the output side of the charge pump circuit 22 so that the output voltage (charge-pumped voltage VINT) from the charge pump circuit 22 is supplied as a power supply to a VINT monitor 26, current source generator 27, and reference voltage generator 28 through the low-pass filter 29 and charge-pumped voltage stabilizing capacitor 30.

The VINT monitor 26 monitors the charge-pumped voltage VINT, and generates a power-on monitoring signal PORINT when the charge-pumped voltage VINT reaches a certain voltage level. The power-on monitoring signal PORINT is supplied to the current source generator 27, reference voltage generator 28, and VCC monitor 23.

An output current ISRC from the current source generator 27 is supplied to the VCC monitor 23 and also to the circuits in the memory.

The reference voltage generator 28 generates the reference voltage VREF using the charge-pumped voltage VINT as a power supply. The reference voltage VREF is supplied to the VCC monitor 23 and also to the circuits in the memory.

The VCC monitor 23 monitors the power supply voltage VCC, and generates the power-on reset signal POR upon monitoring that the power supply voltage VCC reaches a predetermined voltage level by comparison with the reference voltage VREF. The power-on reset signal POR is supplied to the oscillator 21 and VINT-VCC shorting circuit 24.

As the power supply voltage VCC rises, the oscillator 21 automatically starts oscillation to generate a clock pulse. The oscillation operation stops when the power-on reset signal POR supplied from the VCC monitor 23 changes to "H".

Upon receiving the clock pulse, the charge pump circuit 22 performs charge pumping operation to generate the charge-pumped voltage VINT from the power supply voltage VCC. With this operation, the power supply voltage for the circuits such as the current source generator 27 and reference voltage generator 28 can be kept at a voltage level high to some extent.

FIG. 4 shows the oscillator 21, charge pump circuit 22, low-pass filter 29, and stabilizing capacitor 30 in FIG. 3 which use the power supply voltage VCC as a power supply.

The oscillator 21 is actually formed from a ring oscillator formed by connecting an odd number of inverted delay circuits into a ring. The oscillation operation can be performed when the power-on reset signal POR is at "L". The oscillator 21 of this example has the following arrangement. Two inverters 32 and 33 are connected to the output side of a NOR circuit 31 whose one input terminal receives the power-on reset signal POR. Capacitive elements C1, C2, and C3 are respectively connected to the output side of the NOR circuit 31 and the output sides of the respective inverters 32 and 33. The output from the latter inverter 33 is input to the other input terminal of the NOR circuit 31 so that an inverter chain is formed.

Assume that the power supply voltage VCC is supplied to the memory chip. Immediately after the supply, since the POR signal generator 11 is at "L", the oscillation operation of the oscillator 21 is possible. When the power supply voltage VCC exceeds a power supply voltage Vlgc (power supply voltage at which the NOR circuit 31 and inverters 32 and 33 start operating), the oscillator 21 spontaneously starts operating to generate a clock pulse.

The charge pump circuit 22 is formed by connecting I-type NMOS transistors Q1, Q2, and Q3 and charge pump capacitors C4 and C5, as shown in FIG. 4. The input node of this charge pump circuit is connected to the VCC node. When clock pulses having different phases are supplied to terminals of the charge pump capacitors C4 and C5, respectively, charge pumping operation is performed to output the charge-pumped voltage VINT to the output node.

To prevent the size (capability) of the charge pump circuit from becoming too large, the charge pump output node is preferably charged to VCC in advance. To do this, a precharge NMOS transistor Q4 whose drain and gate are connected to each other is connected between the VCC node and the charge pump output node so as to charge the charge pump output node to VCC.

The low-pass filter 29 is formed by connecting a resistive element R and capacitors C6 and C7 as shown in FIG. 4 and has a function of suppressing any fluctuation in potential of the charge-pumped voltage VINT and smoothing it.

The stabilizing capacitor 30 has a function of suppressing any fluctuation in charge-pumped voltage VINT and storing the charge-pumped potential. For example, a capacitor having a MOS structure or a capacitor having a DRAM cell structure can be used.

FIGS. 5 to 10 show the VINT monitor 26, current source generator 27, VCC monitor 23, VINT-VCC shorting circuit 24, and VINT limiter 25 shown in FIG. 3, to which the charge-pumped voltage VINT is supplied. Each circuit using the charge-pumped voltage VINT as a power supply has a power supply symbol of VINT. All logic circuits (an inverter, NAND gate, and the like) without the power supply symbol of VINT use the power supply voltage VCC as a power supply.

The reference voltage generator 28 for generating the reference voltage VREF shown in FIG. 3 uses a BGR (Band-Gap Reference) circuit in the reference voltage generation section to eliminate any temperature dependence of the reference voltage VREF. Additionally, to reduce a variation in output voltage from the BGR circuit due to a manufacturing variation, the reference voltage generator 28 may include a voltage trimming circuit. The voltage trimming circuit corrects the output voltage of the BGR circuit on the basis of data of a fuse element. The data of the fuse element is determined in the test process.

FIG. 5 shows the arrangement of the VINT monitor 26 in FIG. 3.

Figure 1A:
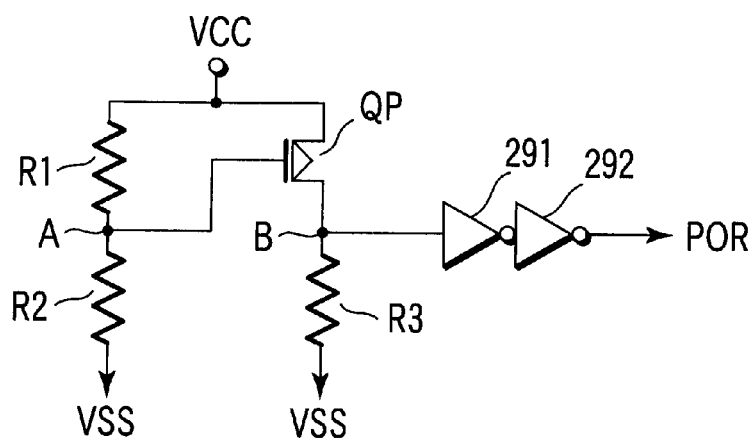
FIG. 1A is a circuit diagram showing a conventional power-on reset circuit.

The arrangement of the VINT monitor is basically the same as that of the conventional power-on reset circuit described above with reference to FIG. 1A, and the same reference numerals as in FIG. 1A denote the same parts in FIG. 5. The circuit shown in FIG. 5 is different from that shown in FIG. 1 in that the charge-pumped voltage VINT is used as a power supply, a delay circuit 41 is inserted between two inverters 291 and 292, and the output signal from the latter inverter 292 is not directly used as the power-on reset signal POR but used as the power-on monitoring signal PORINT.

As the operation of the VINT monitor, the level of the charge-pumped voltage VINT is monitored, and when the level of the charge-pumped voltage VINT reaches the first monitoring level (voltage Vpo1), the power-on monitoring signal PORINT is changed to "H". In this embodiment, since the delay circuit 41 is inserted, the power-on monitoring signal PORINT is changed to "H" after a predetermined delay time Td of the delay circuit 41 from the timing at which the level of the charge-pumped voltage VINT has reached Vpo1. The function of this delay will be described later.

The first monitoring level Vpo1 may change due to a variation in threshold value of a transistor used or the temperature, similarly as a power-on reset circuit of the prior art. Hence, the power-on monitoring signal PORINT is used only in the POR signal generator 11 shown in FIG. 2 and not in the peripheral circuit 13.

FIG. 6 shows the arrangement of the current source generator 27 in FIG. 3. In this current source generator, a PMOS transistor 51, an NMOS transistor 52 whose drain and gate are connected to each other, and a diode 53 are connected in series between the VINT node (the connection node of a stabilizing capacitor C) and the VSS node.

In addition, a PMOS transistor 54 whose gate and drain are connected to each other, a NMOS transistor 55, and a resistive element 56 are connected in series between the VINT node and the VSS node. In this case, the gates of the PMOS transistors 51 and 54 are connected to each other, and the gates of the NMOS transistors 52 and 55 are connected to each other.

Furthermore, a PMOS transistor 57 and an NMOS transistor 58 whose drain and gate are connected to each other are connected in series between the VINT node and the VSS node. The gate of the PMOS transistor 57 is connected to the drain of the PMOS transistor 54. An NMOS transistor 59 is connected between the VSS node and the gate of the PMOS transistor 57. The current ISRC is output from the drain of the PMOS transistor 57. The power-on monitoring signal PORINT is inverted by an inverter 60 and input to the gate of the NMOS transistor 59 to initialize the circuit.

The output current ISRC of this current source generator is supplied as a current source to be used by an operational amplifier of the reference voltage generator 28 or VCC monitor 23 shown in FIG. 3.

Figure 7:
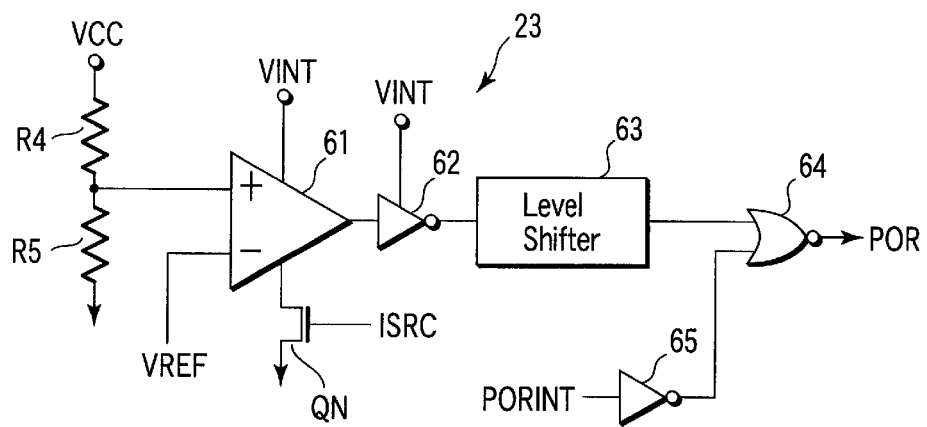
FIG. 7 is a circuit diagram showing the VCC monitor in FIG. 3.

FIG. 7 shows the arrangement of the VCC monitor in FIG. 3. This VCC monitor has the following arrangement. Resistive elements R4 and R5 divide the power supply voltage VCC. An operational amplifier 61 using the charge-pumped voltage VINT as the operation power supply compares the divided voltage of the power supply voltage VCC by the resistive elements R4 and R5 with the reference voltage VREF. The current source of the operational amplifier 61 is controlled by a NMOS transistor QN.

An inverter 62 using the charge-pumped voltage VINT as the operation power supply receives the output from the operational amplifier 61. A level shifter 63 using the power supply voltage VCC as the operation power supply receives the output from the inverter 62. One input terminal of a 2-input NOR gate 64 using the power supply voltage VCC as the operation power supply receives the output from the level shifter 63.

An inverter 65 using the power supply voltage VCC as the operation power supply receives the power-on monitoring signal PORINT, and a signal obtained by inverting the power-on monitoring signal PORINT is input to the other input terminal of the 2-input NOR gate 64. The output signal from the NOR gate 64 is used by the oscillator 21 or VINT-VCC shorting circuit 24 shown in FIG. 3 or the peripheral circuit 13 shown in FIG. 2 as the power-on reset signal POR.

As the operation of the VCC monitor, the power supply voltage VCC is monitored, and when the power supply voltage VCC reaches a predetermined voltage Vpo2, the power-on reset signal POR is changed to "H". While the power-on monitoring signal PORINT is at "L", the output from the inverter 65 is at "H", so the power-on reset signal POR as the output signal from the NOR gate 64 is forcibly set at "L".

Since the VCC monitor uses the reference voltage VREF which has no temperature dependence and the operational amplifier 61, the monitoring level Vpo2 varies little.

Figure 8:
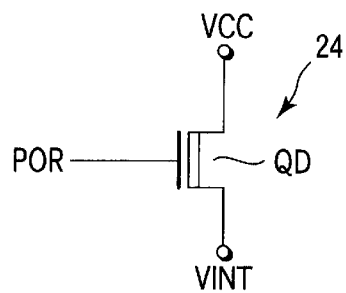
FIG. 8 is a circuit diagram showing the VINT-VCC shorting circuit in FIG. 3.

FIG. 8 shows the arrangement of the VINT-VCC shorting circuit 24 in FIG. 3. As the arrangement of the VINT-VCC shorting circuit, a D-type NMOS transistor QD is connected between the VCC node and the VINT node (the connection node of the stabilizing capacitor), and the power-on reset signal POR is input to the gate of the transistor QD.

As the operation of the VINT-VCC shorting circuit, the VCC node and the VINT node are short-circuited by the transistor QD during a period when the power-on reset signal POR is at "H".

Figure 9:
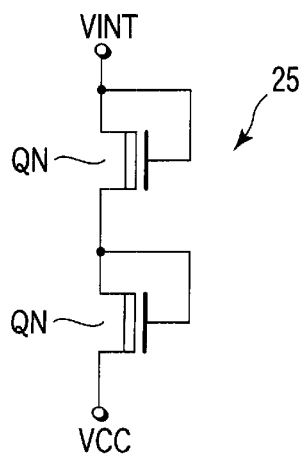
FIG. 9 is a circuit diagram showing the VINT limiter in FIG. 3.

FIG. 9 shows the arrangement of the VINT limiter 25 in FIG. 3.

This VINT limiter is formed by inserting a plurality of (two in this example) diode-connected D-type NMOS transistors QN between the VINT node (the connection node of the stabilizing capacitor C) and the VCC node.

As the operation, the VINT limiter has a function of limiting the value of the charge-pumped voltage VINT such that the potential difference between the charge-pumped voltage VINT and the power supply voltage VCC becomes a predetermined value or more. This prevents any destruction of the transistor by the charge-pumped voltage VINT.

Figure 10:
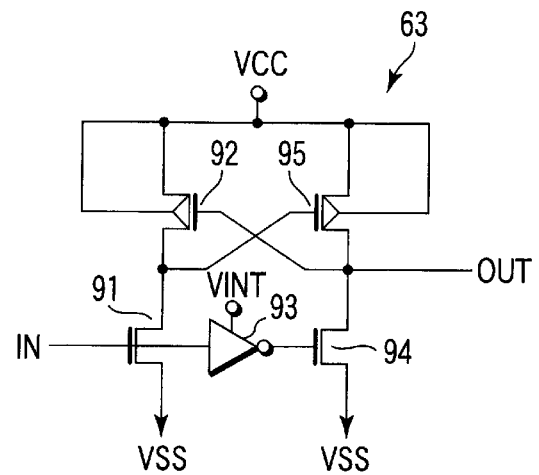
FIG. 10 is a circuit diagram showing the level shifter in FIG. 7.

FIG. 10 shows the arrangement of the level shifter 63 in FIG. 7. This level shifter has the following arrangement.

An input signal IN of the VINT system is input to the gate of an NMOS transistor 91. The source of the NMOS transistor 91 is connected to the VSS node. The source-drain path of a PMOS transistor 92 is connected between the VCC node and the drain of the NMOS transistor 91. An inverter 93 using the charge-pumped voltage VINT as the operation power supply receives the input signal IN of the VINT system. The output from the inverter 93 is input to the gate of an NMOS transistor 94. The source of the NMOS transistor 94 is connected to the VSS node.

The source-drain path of a PMOS transistor 95 is connected between the VCC node and the drain of the NMOS transistor 94. The back-gates of the two PMOS transistors 92 and 95 are connected to the VCC node, and their gates and drains are cross-coupled. An output signal OUT of the VCC system is output from the drain of the PMOS transistor 95.

Figure 11:
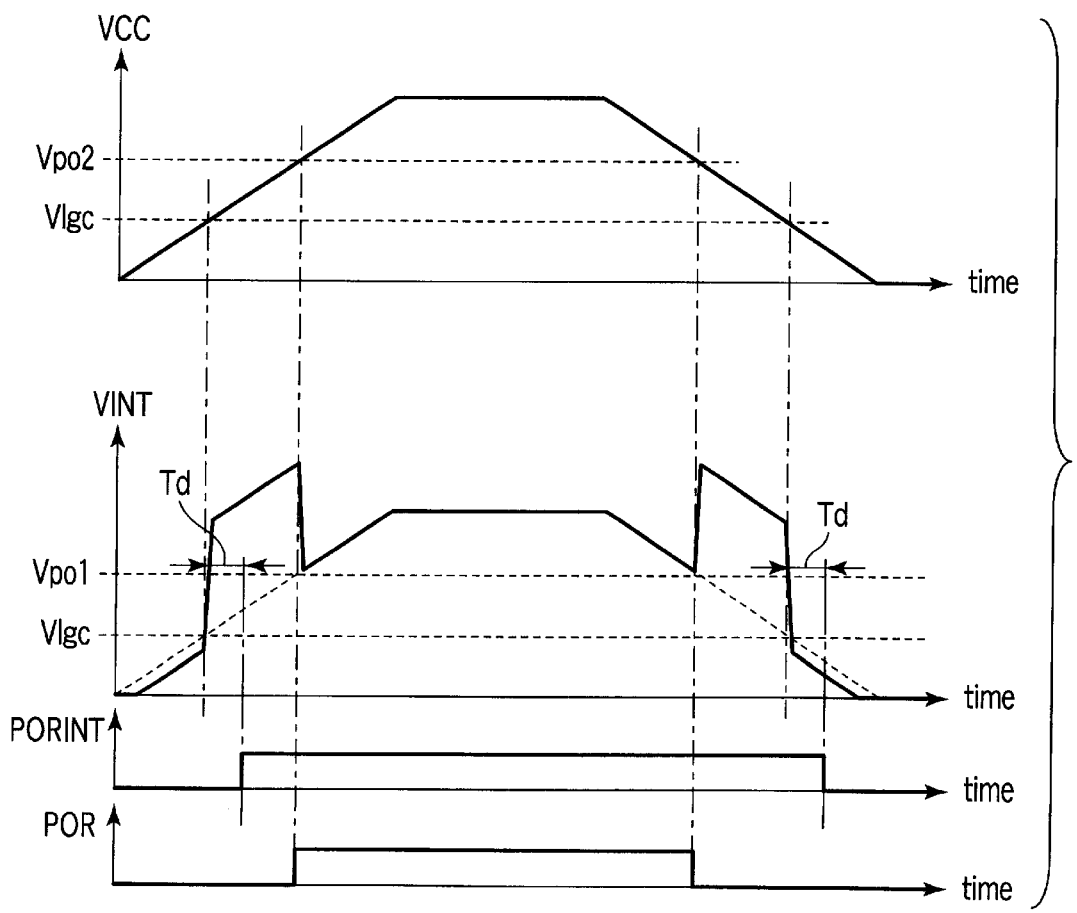
FIG. 11 is a timing chart for explaining the operation of the POR signal generator shown in FIG. 3.

FIG. 11 is a timing chart showing the operation of the POR signal generator in FIG. 3. The operation (behaviors of VINT, PORINT, and POR in accordance with the rise/drop of VCC) of the POR signal generator shown in FIG. 3 will be described with reference to FIG. 11.

(1) When the power supply voltage VCC is supplied to the chip, and VCC>Vlgc, the oscillator 21 automatically starts operating to generate the charge-pumped voltage VINT. After the charge-pumped voltage VINT becomes higher than the first monitoring level Vpo1 and then the delay time Td has elapsed, the monitoring signal PORINT changes to "H". During the delay time Td, the current source generator 27, reference voltage generator 28, and VCC monitor 23 are rendered operative.

When the power supply voltage VCC further rises to be higher than the second monitoring level Vpo2, the VCC monitor 23 monitors it and changes the power-on reset signal POR to "H". When the signal POR changes to "H", the operation of the oscillator 21 stops, and the VINT node and VCC node are short-circuited by the VINT-VCC shorting circuit 24.

(2) When the power supply voltage VCC drops, the circuit operates in an order reverse to the above operation.

In the above operation, since the VCC monitor 23 compares the voltages using the operational amplifier 61, the second monitoring level Vpo2 is more accurate than the monitoring level of the conventional power-on reset circuit shown in FIG. 1. In addition, since the charge-pumped voltage VINT is used as the operation power supply of the operational amplifier 61, the operational amplifier 61 operates even when the power supply voltage VCC is low. The second monitoring level Vpo2 is determined such that $$\max(\text{Vlgc}, \text{Valg}) < \text{Vpo2} < \text{VCCmin}$$

The POR signal generator 11 shown in FIG. 3 generates the current source ISRC and reference voltage VREF as well as the power-on reset signal POR. In this case, since not the power supply voltage VCC but the charge-pumped voltage VINT is used as the operation power supply of the current source generator 27 and reference voltage generator 28, the generators 27 and 28 operate even when the power supply voltage VCC is low.

Hence, according to the above-described POR signal generator 11 shown in FIG. 3, a power-on reset circuit free from any variation, whose power-on monitoring level does not depend on the temperature or a variation in threshold value of a transistor, can be implemented.

In the first example of the POR signal generator, to reduce current consumption of the chip, when VCC>Vpo2, the operation of the oscillator 21 is stopped, and the VINT node and VCC node are short-circuited by the VINT-VCC shorting circuit 24. Such power consumption reduction means is significant in a nonvolatile memory that requires a low standby power.

However, in a memory such as a DRAM or SRAM which consumes a high standby power, saving the current consumption of the oscillator 21 and charge pump circuit 22 is not so effective for reduction of power consumption of the chip. For such a semiconductor product, the VINT-VCC shorting circuit 24 may be omitted, and the oscillator 21 may be continuously operated even when VCC>Vpo2. In this case, the oscillator 21 always operates when VCC>Vpo2.

<Second Example of POR Signal Generator>

In the VINT limiter 25 shown in FIG. 9, a plurality of diode-connected D-type NMOS transistors are inserted between the VINT node and the VCC node. As shown in FIG. 11, while the charge pump circuit is operating, the potential difference between the VINT node and the VCC node is kept constant. Hence, when the power supply voltage VCC becomes high, the charge-pumped voltage VINT also becomes high. When the power supply voltage VCC almost equals the second monitoring level Vpo2, the charge-pumped voltage VINT has a maximum value.

However, when the maximum voltage of the charge-pumped voltage VINT is too high, the transistor connected to the charge-pumped voltage VINT breaks down. To prevent such breakdown, a VINT limiter as shown in FIG. 12 to be described next may be used.

Figure 12:
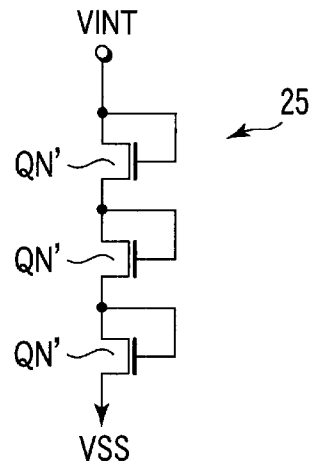
FIG. 12 is a circuit diagram showing a modification to the VINT limiter in FIG. 9.

FIG. 12 is a circuit diagram showing a modification to the VINT limiter in FIG. 9. In this VINT limiter, a plurality of (three in this example) diode-connected E-type NMOS transistors QN' are inserted between the VINT node and the VSS node.

Figure 13:
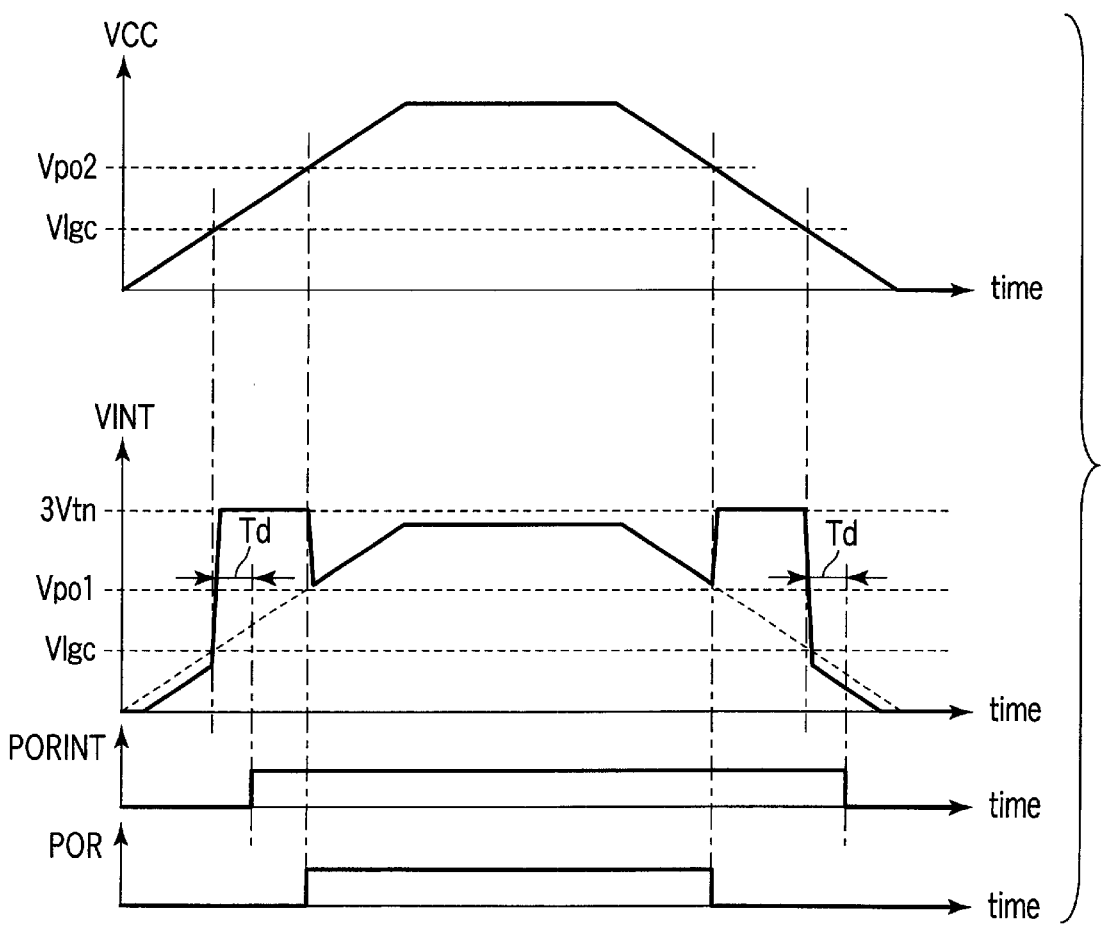
FIG. 13 is a timing chart for explaining the operation of a POR signal generator using the VINT limiter shown in FIG. 12.

FIG. 13 is a timing chart showing the operation of the second example of the POR signal generator using the VINT limiter shown in FIG. 12.

While the charge pump circuit is operating, the limit voltage of the charge-pumped voltage VINT is kept constant at 3Vtn (Vtn is the threshold voltage of the diode-connected NMOS transistors QN). For this reason, the charge-pumped voltage VINT does not depend on the power supply voltage VCC, and the charge-pumped voltage VINT does not become too high.

<Third Example of POR Signal Generator>

In the above-described first and second examples of the POR signal generator, the charge pump circuit 22 always operates while Vlgc<VCC<Vpo2, and therefore, the current consumption of the chip during this period is large. The third example of the POR signal generator capable of preventing any increase in current consumption in accordance with the value of the power supply voltage VCC will be described below.

Figure 14:
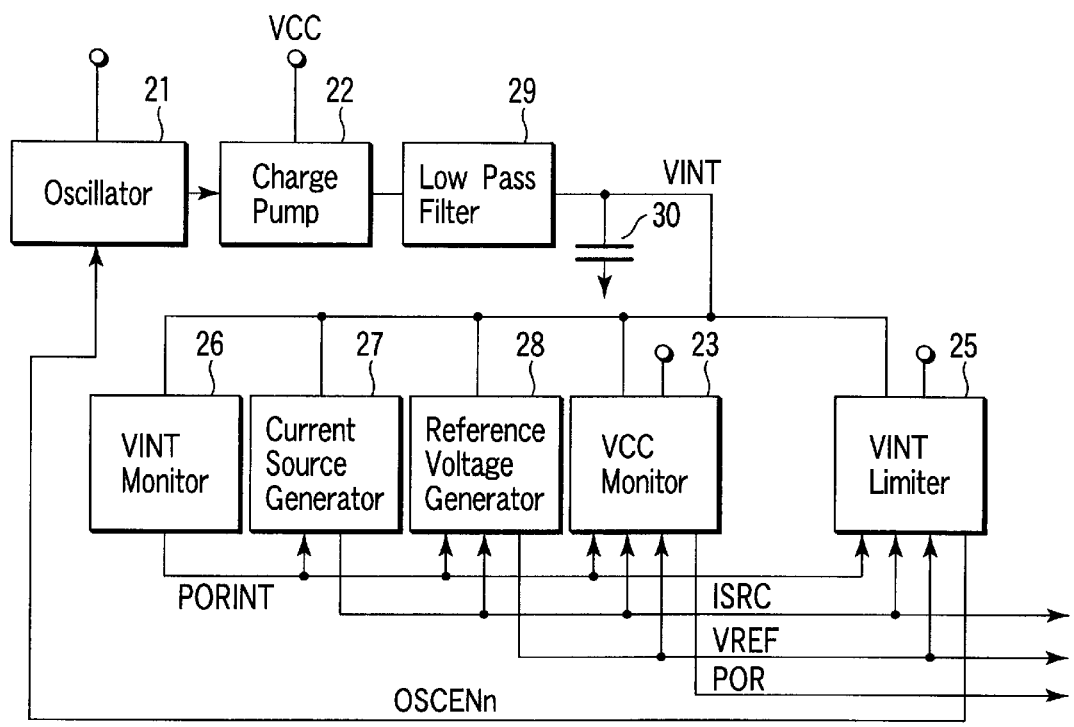
FIG. 14 is a block diagram showing the third example of the POR signal generator in FIG. 2.

FIG. 14 is a block diagram showing the third example of the POR signal generator in FIG. 2. This POR signal generator is different from that described above with reference to FIG. 3 in that a VINT-VCC shorting circuit 24 is omitted, a VINT limiter 25a has a different arrangement, and not an output signal POR from a VCC monitor 23 but an output signal OSCENn from the VINT limiter 25a is used to control the start/stop of the oscillation operation of an oscillator 21. The remaining parts are the same as in FIG. 3, and the same reference numerals as in FIG. 3 denote the same parts in FIG. 14.

Figure 15:
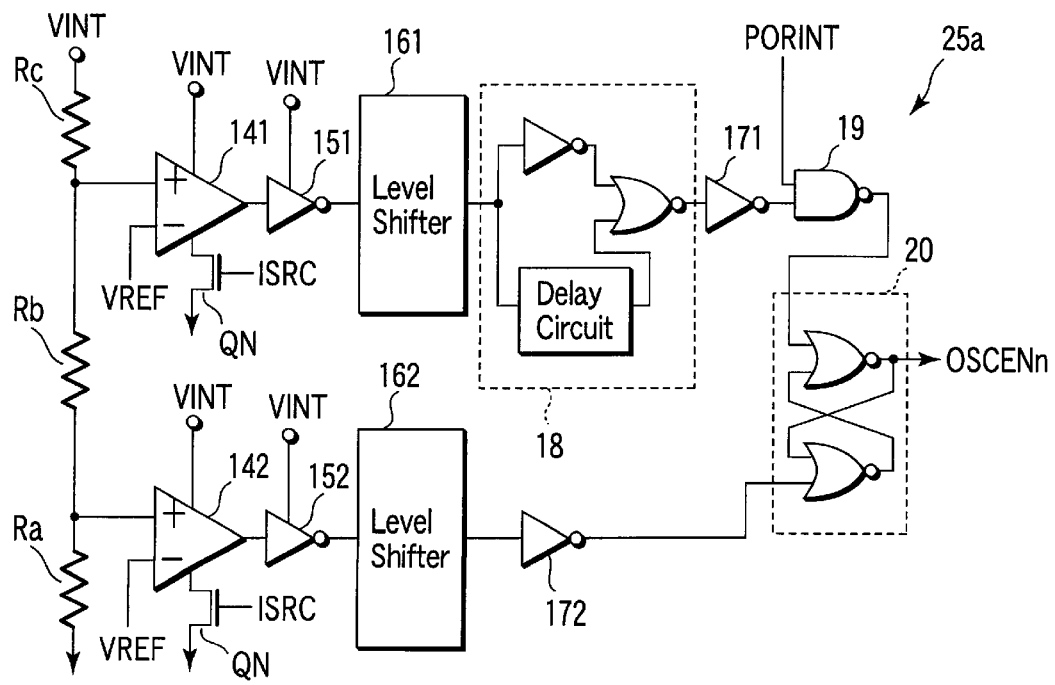
FIG. 15 is a circuit diagram showing the VINT limiter in FIG. 14.

FIG. 15 is a circuit diagram showing the arrangement of the VINT limiter 25a in FIG. 14. In this VINT limiter, resistors Rc, Rb, and Ra are connected in series between the VINT node and the VSS node to generate two divided voltages. Two comparators for comparing the two divided voltages with a reference voltage VREF are present.

One system has the following arrangement. A first operational amplifier 141 using the charge-pumped voltage VINT as the operation power supply compares the first divided voltage with the reference voltage VREF. The current source of the first operational amplifier 141 is controlled by an NMOS transistor QN. The output from the first operational amplifier 141 is input to an inverter 151 using the charge-pumped voltage VINT as the operation power supply.

The output from the inverter 151 is input to a first level shifter 161 using the power supply voltage VCC as the operation power supply. A leading edge signal monitor 18 using the power supply voltage VCC as the operation power supply monitors the leading edge of the output from the first level shifter 161. The output from the leading edge signal monitor 18 is input to an inverter 171. The output from inverter 171 is input to one input terminal of a 2-input NAND gate 19.

The other system has the following arrangement. A second operational amplifier 142 using the charge-pumped voltage VINT as the operation power supply compares the second divided voltage with the reference voltage VREF. The current source of the second operational amplifier 142 is controlled by the NMOS transistor QN. The output from the second operational amplifier 142 is input to an inverter 152 using the charge-pumped voltage VINT as the operation power supply. The output from the inverter 152 is input to a second level shifter 162 using the power supply voltage VCC as the operation power supply. The output from the second level shifter 162 is input to an inverter 172 using the power supply voltage VCC as the operation power supply.

The output from the NAND gate 19 of the one system becomes the set input of a flip-flop circuit 20. The output from the inverter 172 of the other system becomes the reset input of the flip-flop circuit 20. The output signal OSCENn from the flip-flop circuit 20 is used to control the start/end of the oscillation operation of the oscillator 21.

The VINT limiter 25a has two kinds of monitoring levels Vint1 and Vint2 (Vint1<Vint2) given by $$Vint1 = VREF \times (Ra+Rb+Rc)/(Ra+Rb)$$

$$Vint2 = VREF \times (Ra+Rb+Rc)/Ra$$

The values of the monitoring levels Vint1 and Vint2 are determined by the reference voltage VREF and resistors Ra, Rb, and Rc and can be adjusted by changing the ratio of the resistance values of the resistors Ra, Rb, and Rc.

The operation (transitions of VINT, PORINT, and POR in accordance with the rise/drop of VCC) of the POR signal generator shown in FIG. 14 will be described with reference to FIG. 16.

When the device is powered on, and when the charge-pumped voltage VINT drops so VINT<Vint1, the output signal OSCENn changes to "H" to operate the oscillator 21.

When VINT>Vint2, the output signal OSCENn changes to "L" to stop the operation of the oscillator 21. This stop state is maintained until VINT<Vint1. Letting I be the current consumption of a circuit connected to the charge-pumped voltage VINT and C be the capacitive value of the stabilizing capacitor, a stop period T is given by $$T = C(Vint2-Vint1)/I$$

Hence, the oscillator 21 and charge pump circuit 22 shown in FIG. 14 sporadically operate, and the charge-pumped voltage VINT falls within the range of Vint1<VINT<Vint2. Since the oscillator 21 only sporadically operates, its current consumption is small. Hence, the current consumption of the entire POR signal generator can be adjusted by appropriately selecting the values I and C.

In the above description, even when VCC>Vpo2, the oscillator 21 is sporadically operated. However, as in the above-described first and second examples of the POR signal generator, when VCC>Vpo2, the operation of the oscillator 21 may be forcibly stopped so that VCC=VINT. That is, in addition to the condition for the charge-pumped voltage VINT, a condition that the power supply voltage VCC satisfies Vlgc<VCC<Vpo2 may be added as a condition for sporadically operating the oscillator 21.

(Second Embodiment)

The power-on reset signal generation scheme of the present invention can also be applied to a voltage down converter system in a semiconductor device. A semiconductor memory according to the second embodiment, which uses a voltage down converter system, will be described below.

Figure 17:
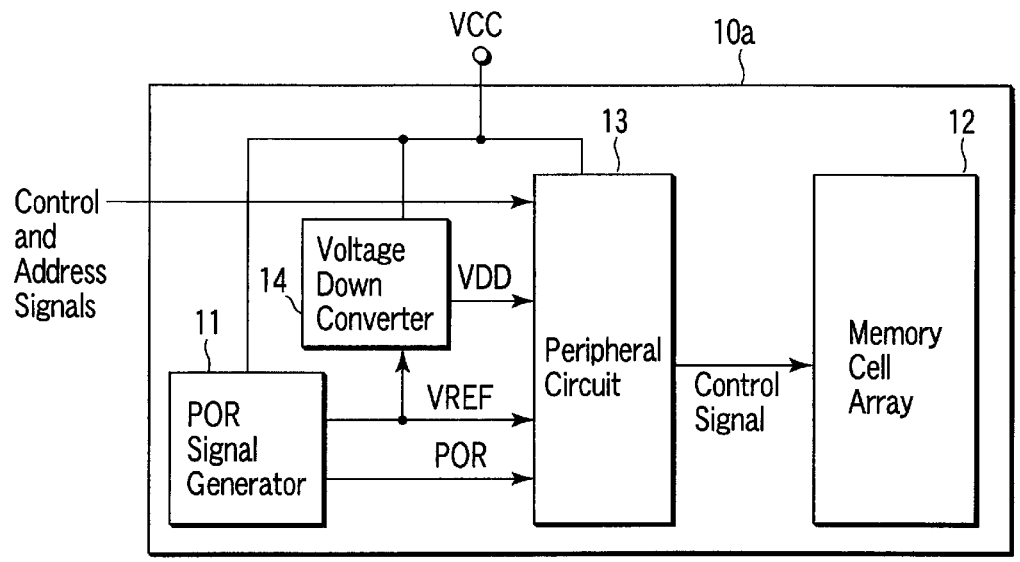
FIG. 17 is a block diagram schematically showing the arrangement of a semiconductor memory according to the second embodiment.

FIG. 17 schematically shows the arrangement of a memory chip 10a of the semiconductor memory according to the second embodiment of the semiconductor device of the present invention.

The memory chip 10a is the same as the memory chip 10 described above with reference to FIG. 2 except that a voltage down converter 14 which generates a dropped power supply voltage VDD from a power supply voltage VCC and reference voltage VREF and supplies the dropped power supply voltage VDD to a peripheral circuit 13 as a main power supply is added, and the same reference numerals as in FIG. 2 denote the same parts in FIG. 17.

In a memory using such a voltage down converter system, a power-on reset signal generator which changes a power-on reset signal PORVDD to "H" when the dropped power supply voltage VDD becomes higher than a predetermined voltage is necessary.

When the present invention is applied to such a power-on reset signal generator for the dropped power supply voltage VDD, temperature dependence of the monitoring level of the dropped power supply voltage VDD can be eliminated.

<Fourth Example of POR Signal Generator>

Figure 18:
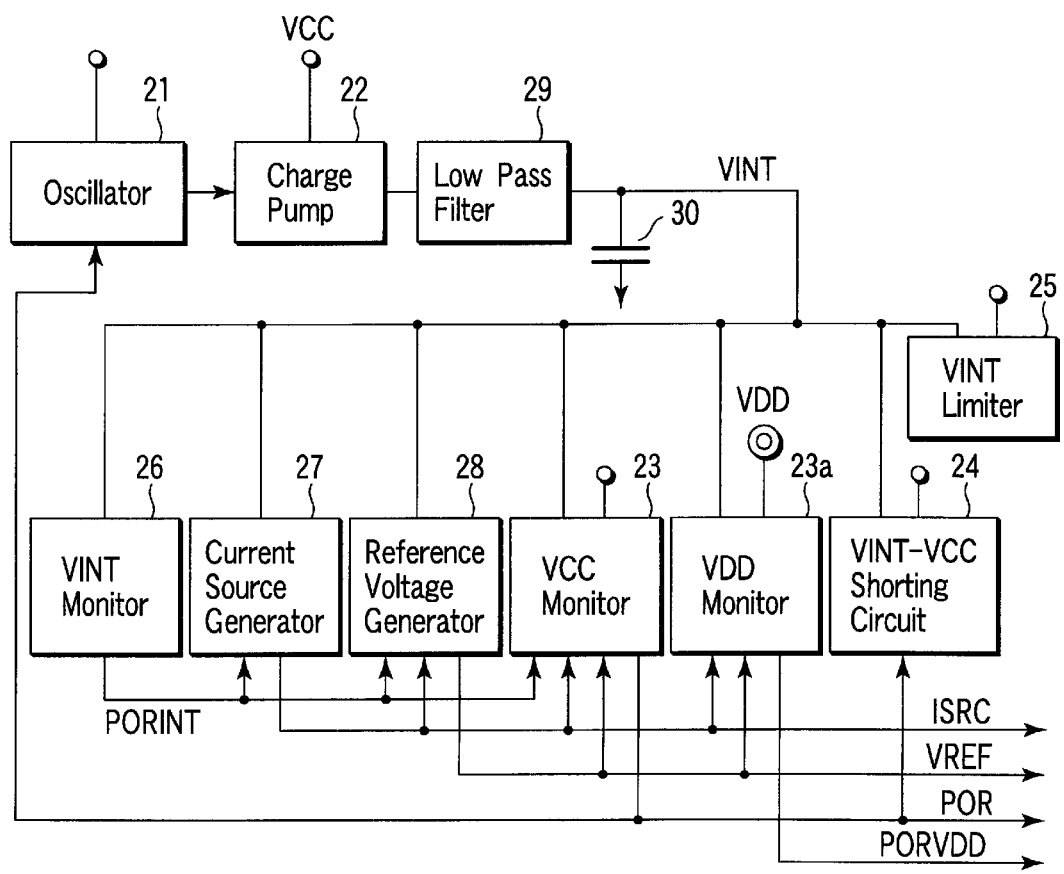
FIG. 18 is a block diagram showing the fourth example of the POR signal generator.

FIG. 18 shows the arrangement of the fourth example of the POR signal generator. This POR signal generator is the same as the first example of the POR signal generator described above with reference to FIG. 3 except that a VDD monitor 23a is added, and the same reference numerals as in FIG. 3 denote the same parts in FIG. 18.

Figure 19:
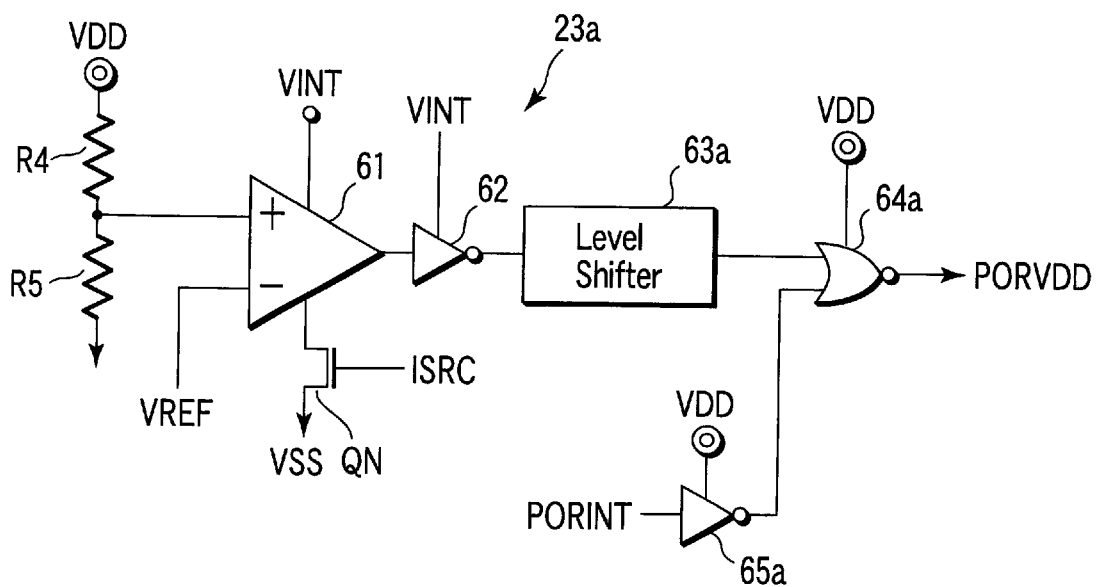
FIG. 19 is a circuit diagram showing the VDD monitor in FIG. 18.

FIG. 19 shows the VDD monitor 23a in FIG. 18. The arrangement of the VDD monitor is the same as that of the VCC monitor described above with reference to FIG. 7 except that (1) the dropped power supply voltage VDD is resistance-divided, and (2) the dropped power supply voltage VDD is supplied as the operation power supply of a level shifter 63a, NOR gate 64a, and inverter 65a, and the same reference numerals as in FIG. 7 denote the same parts in FIG. 19.

As the operation of the VDD monitor, the resistance-divided value of the dropped power supply voltage VDD is monitored, and upon monitoring that the dropped power supply voltage VDD reaches a predetermined voltage Vpo2, the second power-on reset signal PORVDD is changed to "H". While a power-on monitoring signal PORINT is at "L", the output from the inverter 65a is at "H", so the power-on reset signal PORVDD as the output signal from the NOR gate 64a is forcibly set at "L".

Since the VDD monitor uses the reference voltage VREF which has no temperature dependence and an operational amplifier 61, the monitoring level Vpo2 varies little.

Figure 20:
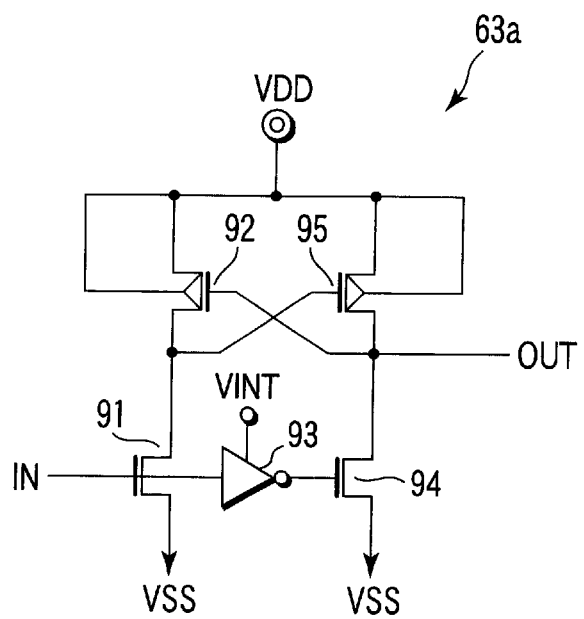
FIG. 20 is a circuit diagram showing the level shifter in FIG. 19.

FIG. 20 is a circuit diagram showing the level shifter 63a in FIG. 19. This level shifter is the same as that described above with reference to FIG. 10 except that the operation power supply VDD is supplied in place of the operation power supply VCC, and the same reference numerals as in FIG. 10 denote the same parts in FIG. 20.

Not the fourth example of the POR signal generator but any one of the above-described first to third examples of the POR signal generator may be applied to the above-described voltage down converter system in the semiconductor memory according to the second embodiment.

A semiconductor memory has been exemplified above. However, the present invention can be applied to any other semiconductor device that requires power-on reset operation.

<Fifth Example of POR Signal Generator>

In each of the above-described examples of the POR signal generator, the monitoring level of the power supply voltage can be freely set. However, when a power-on reset signal POR is used only to reset logic circuits, a power-on monitoring level Vpo can equal a voltage Vlgc, and a POR signal generator with a simple arrangement can be used, as will be described below.

FIG. 21 shows the arrangement of the fifth example of the POR signal generator. This POR signal generator is the same as the first example of the POR signal generator described above with reference to FIG. 3 except that a VCC monitor 23, current source generator 27, and reference voltage generator 28 are omitted, and the arrangement of a voltage monitor 26a is slightly changed, and the same reference numerals as in FIG. 3 denote the same parts in FIG. 21. As a VINT limiter 25 shown in FIG. 21, the circuit shown in FIG. 9 or 12 is used.

The voltage monitor 26a is formed by omitting a delay circuit 41 in the VINT monitor 26 described above with reference to FIG. 5. The voltage monitor 26a monitors a charge-pumped voltage VINT, and generates the power-on reset signal POR when the charge-pumped voltage VINT reaches a certain voltage level.

<Sixth Example of POR Signal Generator>

Figure 22:
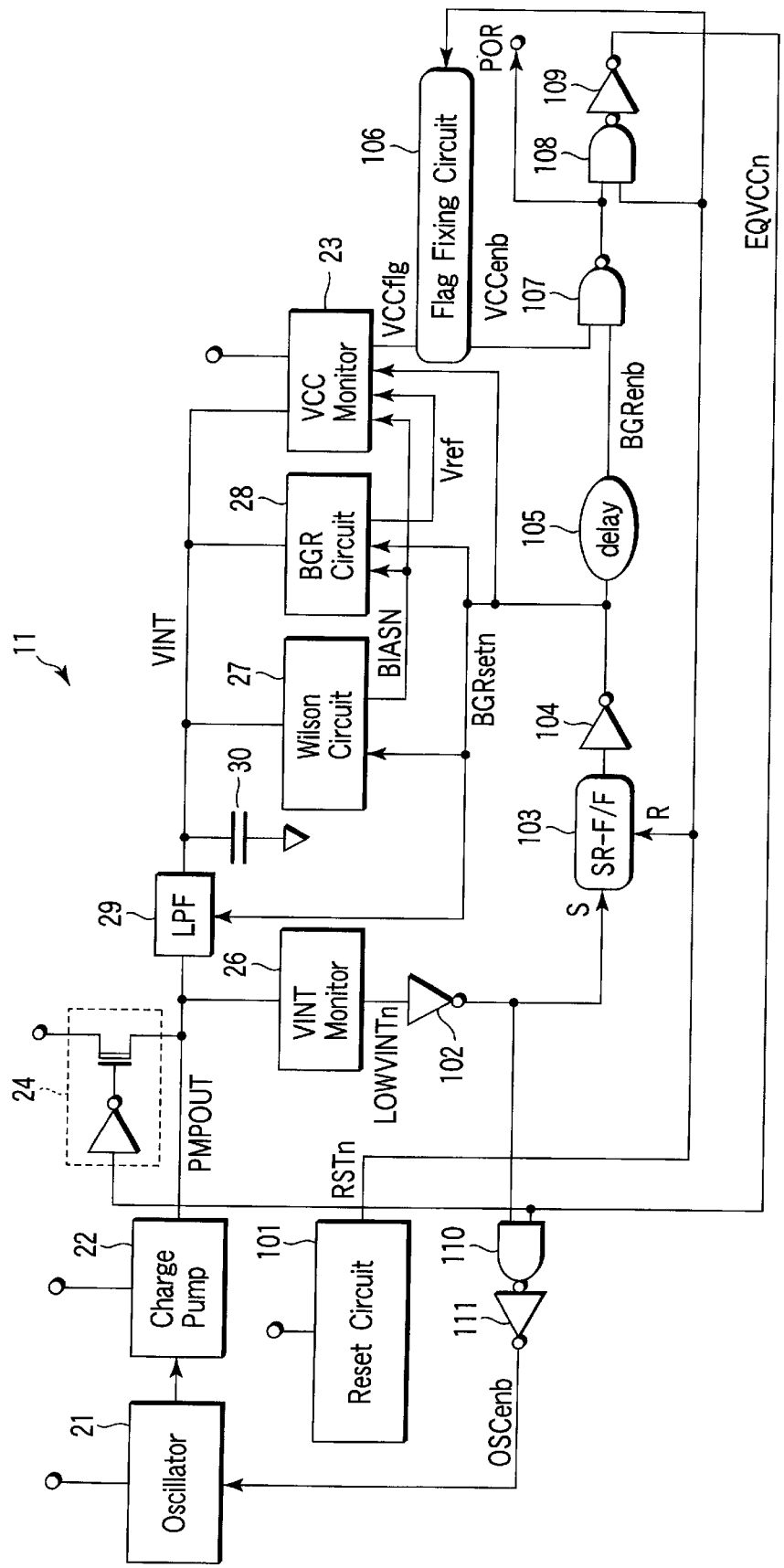
FIG. 22 is a block diagram showing the sixth example of the POR signal generator.

FIG. 22 shows the arrangement of the sixth example of the POR signal generator. This POR signal generator is different from the first example of the POR signal generator described above with reference to FIG. 3 in that a VINT monitor 26 is connected to monitor the voltage of the output node of a charge pump circuit 22, a VINT-VCC shorting circuit 24 is connected to the output node of the charge pump circuit 22, a Wilson circuit is used as a current source generator 27, a BGR circuit is used as a reference voltage generator 28, and circuits to be described later are added. The same reference numerals as in FIG. 3 denote the same parts in FIG. 22.

The circuits added in this example are (1) a reset circuit 101, (2) an inverter 102 for inverting the output signal from the VINT monitor 26, (3) an SR-type flip-flop (F/F) circuit 103 for latching the output signal from the inverter 102 and an inverter 104 which inverts the output signal from the F/F circuit 103 and outputs, in place of the output signal from the VINT monitor 26 in FIG. 3, a signal BGRsetn for controlling the Wilson circuit 27, BGR circuit 26, VCC monitor 23, and LPF (Low-Pass Filter) 29, (4) a delay circuit 105 for delaying the output signal BGRsetn from the inverter 104 by a predetermined time (several ten µs in this example), (5) a flag fixing circuit 106 for fixing a VCC monitoring flag output VCCflg from the VCC monitor 23 for a predetermined time (several ten µs in this example), (6) a NAND circuit 107 for receiving an output signal VCCenb from the flag fixing circuit 106 and an output signal BGRenb from the delay circuit 105 and outputting a signal POR, (7) a NAND circuit 108 for receiving the output signal POR from the NAND circuit 107 and an output signal RSTn from the reset circuit 101, and an inverter 109 for inverting the output signal from the NAND circuit 108 and outputting a control signal EQVCCn for the VINT-VCC shorting circuit 24, and (8) a NAND circuit 110 for receiving the output signal EQVCCn from the inverter 109 and the output signal from the inverter 102 on the output side of the VINT monitor 26, and an inverter 111 for inverting the output signal from the NAND circuit 110 and outputting a control signal OSCenb for an oscillator 21.

The operation of the POR signal generator shown in FIG. 22 will be described next.

<At Rise Time of VCC>

(1) Since the requirement for the rise speed of the power supply VCC changes depending on the user, the relationship between the power supply voltage VCC and the setup time of the reference voltage system circuits (Wilson circuit 27, BGR circuit 28, and the like) is not simple. The system is divided into the system of power supply VCC and the system of charge-pumped power supply VINT. The power supply voltage VCC is not monitored until setup of the reference voltage system circuits is ended.

(2) When the power supply voltage VCC reaches about 1.1 V, the oscillator 21 starts operating. From this time, the charge pump circuit 22 starts charge pumping operation. To reduce the charge pumping capability, the output node is preferably charged to VCC in advance. To do this, before the power supply voltage VCC reaches the level Vlgc, the reset circuit 101 is caused to activate the output signal EQVCCn from the inverter 109 such that the VINT-VCC shorting circuit 24 is turned on to charge the output node of the charge pump circuit 22 to VCC.

(3) During the period before the charge-pumped power supply VINT for the reference voltage system circuits rises, the output signal BGRsetn from the inverter 104 is changed to "L" (BGR reset signal) to reset the BGR circuit 28 and the like.

(4) A time of several ten µs is required from when the charge-pumped power supply VINT reaches a predetermined level and the output signal BGRsetn from the inverter 104 changes to "H" (BGR activation signal) until the BGR circuit 28 stabilizes. For this reason, after the operation waits for the period (several ten µs) until the signal BGRsetn is input to the delay circuit 105, and the operation of the BGR circuit 28 stabilizes, the setup completion signal BGRenb is output from the delay circuit 105.

(5) After the end of BGR activation, the VCC monitor 23 starts monitoring the VCC level. When the power supply voltage VCC exceeds a predetermined level, the flag signal VCCflg representing that the power supply voltage VCC has reached the predetermined level is output. This flag signal VCCflg is output from the flag fixing circuit 106 as the signal VCCenb. The signal EQVCCn output from the inverter 109 on the basis of the signal VCCenb and the signal BGRenb controls to stop charge pumping of the charge-pumped voltage VINT and switch the power supply of the reference voltage system circuits to the power supply VCC. Simultaneously, the NAND circuit 107 outputs the power-on reset signal POR (same as the conventional power-on activation signal), thereby ending power-on.

If the potential difference between the power supply voltage VCC and the charge-pumped voltage VINT is large in switching the power supply of the reference voltage system circuits to the power supply VCC, the operational amplifier of the VCC monitor 23 causes an operation error due to the fluctuation in charge-pumped voltage VINT. Hence, the flag fixing circuit 106 is inserted to fix the flag for several ten µs after the output of the flag signal VCCflg.

<At Fall Time of VCC>

(1) The VCC monitor 23 monitors the trailing edge of the power supply voltage VCC, and charge pumping of the charge-pumped voltage VINT is started.

(2) When the VCC monitor 23 monitors that the power supply voltage VCC is restored and exceeds a predetermined level, charge pumping of the charge-pumped voltage VINT is stopped, and the power supply of the reference voltage system circuits is switched to the power supply voltage VCC. If the power supply voltage VCC falls without being restored, the reset circuit 101 monitors the trailing edge and outputs a signal RSTn to generate the signal POR, thereby resetting the entire chip.

Figure 23:
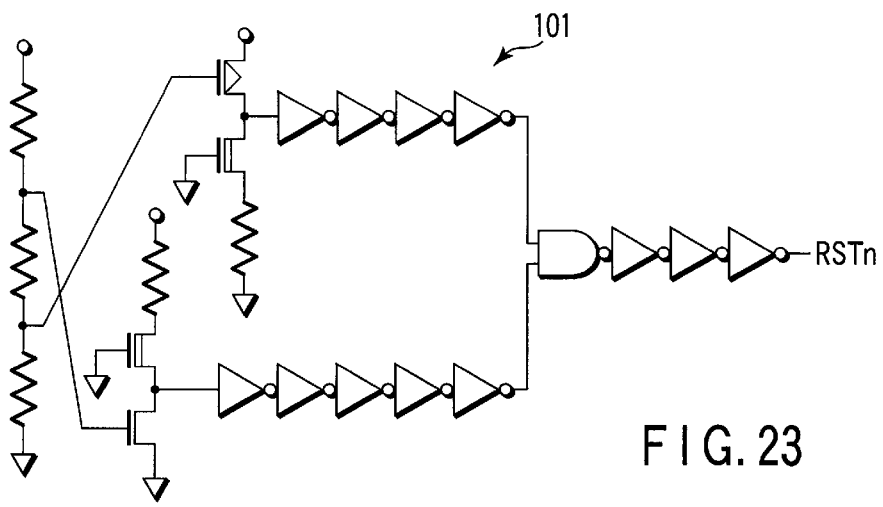
FIG. 23 is a circuit diagram showing the reset circuit in FIG. 22.

FIG. 23 shows the arrangement of the reset circuit 101 in FIG. 22. This reset circuit is formed from the same power-on reset circuit as in the prior art.

Since the power-on monitoring level can be VCCmin at which the inverter operates, setting is done to reset the circuits at a level about, e.g., 1.25 times (VCC=about 1.4 V) that determined by a higher threshold voltage Vth of the PMOS or NMOS transistor.

The reset circuit 101 has three purposes. The first purpose is to generate a control signal for charging the output node of the charge pump circuit 22 to VCC. This operation is performed to quickly raise the charge-pumped voltage VINT of the POR signal generator shown in FIG. 22 at a power as low as possible. The second purpose is to reset the F/F circuit 103. The F/F circuit 103 is used in the POR signal generator shown in FIG. 22 to generate the BGR reset signal BGRsetn on the basis of the output signal LOWVINTn from the VINT monitor 26. The third purpose is to prevent the delay circuit 105 from outputting an unstable level before logic circuits start to operate.

The threshold voltage of the reset circuit 101 may vary to some extent, and no accuracy is required as long as the logic circuits can be reset.

Figure 24:
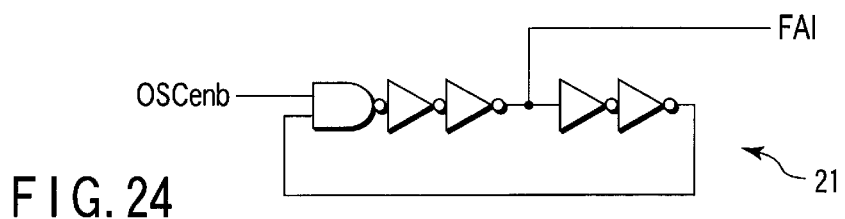
FIG. 24 is a circuit diagram showing the oscillator in FIG. 22.
Figure 25:
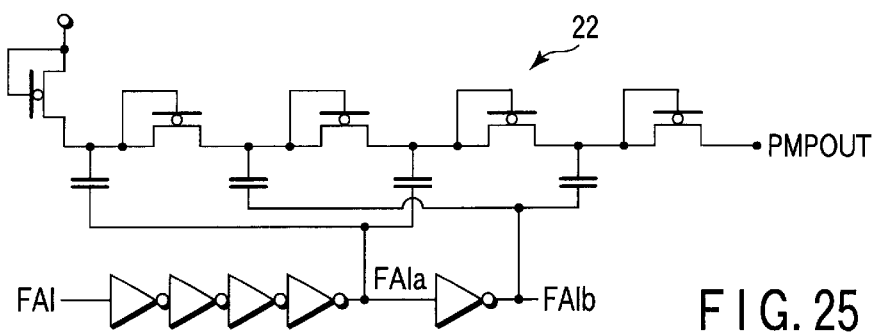
FIG. 25 is a circuit diagram showing the charge pump circuit in FIG. 22.

FIGS. 24 and 25 show the arrangements of the oscillator 21 and charge pump circuit 22 in FIG. 22. The oscillator 21 and charge pump circuit 22 employ, e.g., a 2-phase clock scheme. Their arrangements and operations are known, and a detailed description thereof will be omitted.

Figure 26A:
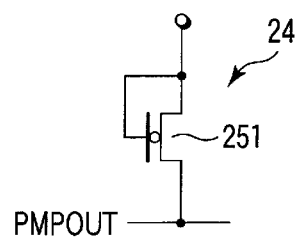
FIGS. 26A and 26B are circuit diagrams showing two different arrangements of the VINT-VCC shorting circuit for charging the output node of the charge pump circuit shown in FIG. 22 to VCC.
Figure 26B:
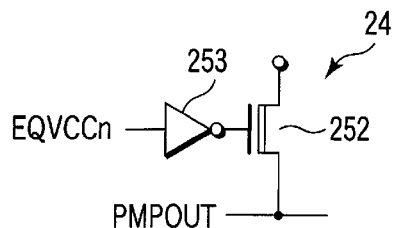

FIGS. 26A and 26B show two different arrangements of the VINT-VCC shorting circuit 24 for charging the output node of the charge pump circuit 22 in FIG. 22 to VCC.

In the VINT-VCC shorting circuit 24 shown in FIG. 26A, the drain-source path of an I-type NMOS transistor 251 whose drain and gate are connected to each other is connected between the VCC node and the VINT charge pump output node.

This arrangement is simple. However, when the power supply voltage VCC is low at the leading edge, the level of the charge-pumped voltage VINT becomes low because of a voltage drop based on the threshold value of the I-type NMOS transistor 251. For example, when the power supply voltage VCC is 2.1 V, the power supply voltage VCC may be 2.0 V or less.

In the VINT-VCC shorting circuit shown in FIG. 26B, the drain-source path of a D-type NMOS transistor 252 is connected between the VCC node and the charge pump output (PMPOUT) node, and a signal obtained by inverting the signal EQVCCn by an inverter 253 is supplied to the gate of the transistor 252.

This arrangement requires the signal EQVCCn and the inverter 253, and the pattern area also becomes large. However, no voltage drop due to the threshold value of the D-type NMOS transistor 252 occurs in short-circuiting the VCC node and VINT node, and the nodes are quickly short-circuited.

FIG. 27 shows the VINT monitor 26 in FIG. 22. The VINT monitor must judge the level of the charge-pumped voltage VINT when the reference voltage VREF is not generated yet and the level of the power supply voltage VCC is undefined because it depends on the rise speed. Hence, the VINT monitor employs the same arrangement as that of the conventional power-on reset circuit shown in FIG. 1.

The variation in monitoring level by the VINT monitor depends on the variation in threshold value of the PMOS transistor. However, the problem of variation can be solved when the charge-pumped voltage VINT reaches a predetermined level larger than VCC minimum of the analog circuit.

FIG. 28 shows the arrangement of the delay circuit (BGR stabilization judgment circuit) 105 in FIG. 22. To judge that the BGR voltage has stabilized, two methods, e.g., time judgment and voltage judgment for the node in the BGR circuit 28 can be used. Since voltage determination is impossible before the reference voltage VREF is generated, time judgment is employed. Since the delay time is on the order of several ten $\mu$s, and the VCC rise speed is on the order of ms, no strict accuracy is required. Hence, the delay circuit 105 formed from an inverter and capacitors CP and CN is used.

For the arrangement of this delay circuit 105, note that if only several ten $\mu$s have elapsed after the inverter in the delay circuit 105 starts operating, an unstable level before the operation of the inverter is output.

As a measure against this problem, the delay circuit 105 having a relatively simple arrangement as shown in FIG. 28 is employed. In this delay circuit 105, an input signal IN that is stabilized by the F/F circuit 103 and inverter 104 on the input side shown in FIG. 22 is delayed by an inverter IV, the capacitor CP formed by short-circuiting the drain and source of a PMOS transistor, and the capacitor CN formed by short-circuiting the drain and source of an NMOS transistor. The delayed signal and input signal IN are input to an AND circuit formed from a 2-input NAND gate 271 and an inverter 272 connected to the output side of the NAND gate 271, both of which use the power supply voltage VCC as the operation power supply.

The VCC monitor 23 shown in FIG. 22 monitors the power supply voltage VCC after the activation of the BGR circuit 28 is ended, and employs almost the same arrangement as that of the VCC monitor 23 described above with reference to FIG. 7 in the first example of the POR signal generator.

FIG. 29 shows the flag fixing circuit 106 in FIG. 22. The flag fixing circuit has the following arrangement. The flag signal VCCflg is input to one input terminal of a first NAND circuit 281. The output from the first NAND circuit 281 is input to one input terminal of a second NAND circuit 282. The output from the second NAND circuit 282 is input to a first inverter 283. The signal from the first inverter 283 is input to a delay circuit 284 for delaying the signal by a predetermined time.

The output from the delay circuit 284 is input to one input terminal of a third NAND circuit 285, and the output from the second NAND circuit 282 is input to another input terminal of the third NAND circuit 285. The output signal RSTn from the reset circuit 101 is input to still another input terminal of the third NAND circuit 285. The output from the third NAND circuit 285 is input to the other input terminal of the second NAND circuit 282.

The output from the delay circuit 284 is input to one input terminal of a NOR circuit 286, and the output from the second NAND circuit 282 is input to its other input terminal. The output from the NOR circuit 286 is input to a second inverter 287. The output from the second inverter 287 is input to the other input terminal of the first NAND circuit 281.

This flag fixing circuit aims at fixing the VCC monitoring flag VCCflg for a predetermined time to prevent any operation error. The operation error means an error that may be caused by the operational amplifier of the VCC monitor 23 due to the influence of a variation in charge-pumped voltage VINT when the VINT node is connected to the VCC node after VCC monitoring.

As described above, according to the power-on reset signal generator arranged in the semiconductor device of this embodiment, the power supply voltage monitoring level is accurate, and particularly, temperature dependence of the monitoring level can be eliminated. In addition, even when the power supply voltage is low, a current source or reference voltage can be generated.

Embodiments in which the present invention is applied to a semiconductor memory device having a ROM fuse will be described next.

A semiconductor memory device normally has a redundancy circuit to improve the yield. A defective cell is removed by storing a defective address and replacing the address with a redundancy memory. Means for storing a defective address can be roughly divided into three means. The first means is a fuse element (laser fuse) which is blown by a laser. The second means is a fuse element (electrical fuse) which is electrically blown by, e.g., a current. As the third means, a specific area of a ROM is used as a fuse element (to be referred to as a ROM fuse hereinafter).

Figure 30:
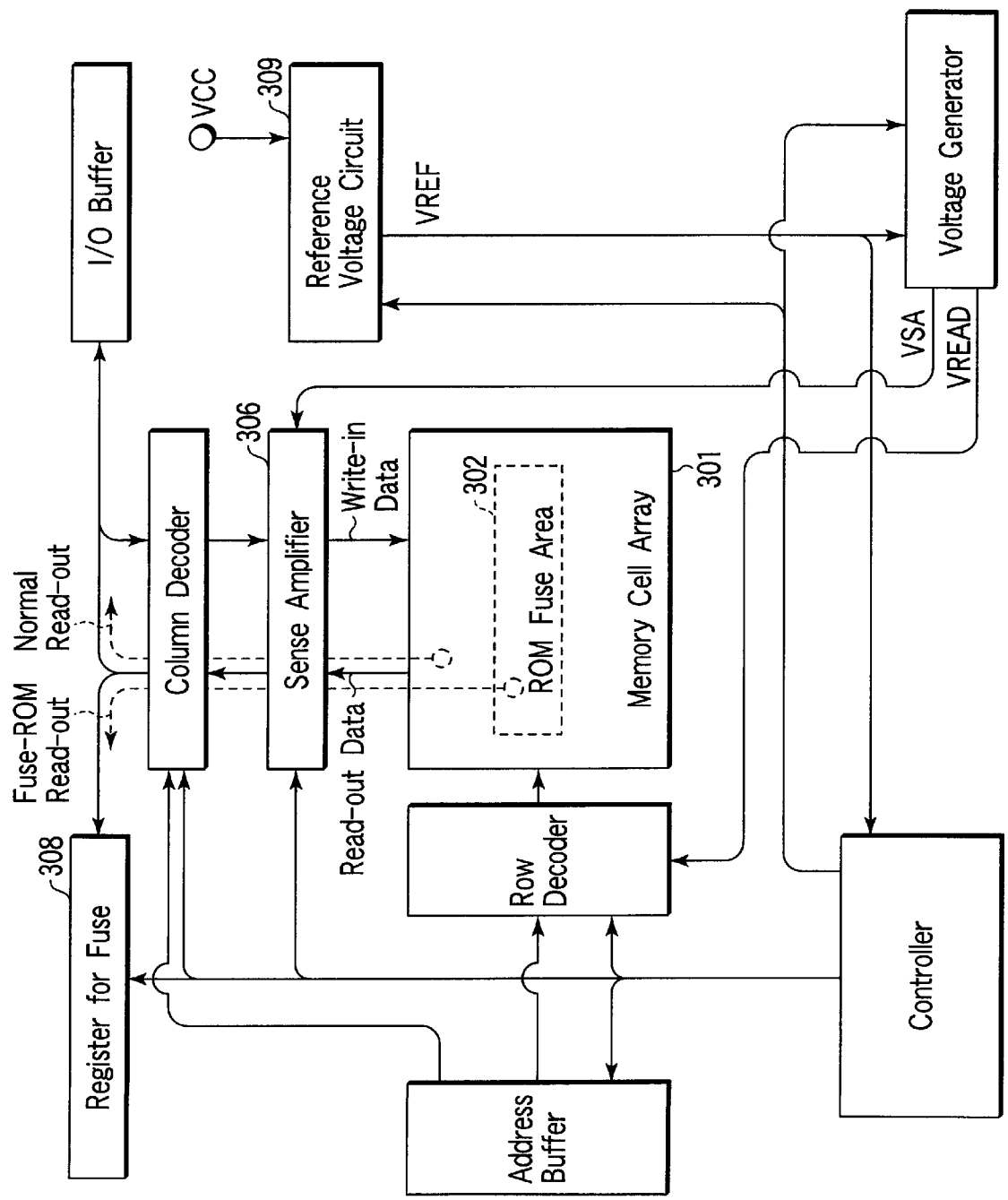
FIG. 30 is a block diagram showing the arrangement of a conventional nonvolatile semiconductor memory device having a ROM fuse.

In the following embodiments, assume a nonvolatile semiconductor memory device which uses a ROM fuse and has an arrangement shown in FIG. 30.

In a nonvolatile semiconductor memory device using a ROM fuse, a specific portion of a memory cell array 301 is used as a ROM fuse area 302. Data of defective addresses are stored in the ROM fuse area 302. The data stored in the ROM fuse area 302 must be read out through a sense amplifier 306 serving as an interface between the memory cell array 301 and an external device. That is, for any operation, read-out operation must be performed upon power-on to read out the data from the ROM fuse area 302, and the data is set in a register 308 for fuse in a peripheral circuit. In this embodiment, such read-out operation will be referred to as a ROM read-out.

Operation at the time of power-on and ROM read-out will be described next with reference to a voltage waveform chart.

Figure 1B:
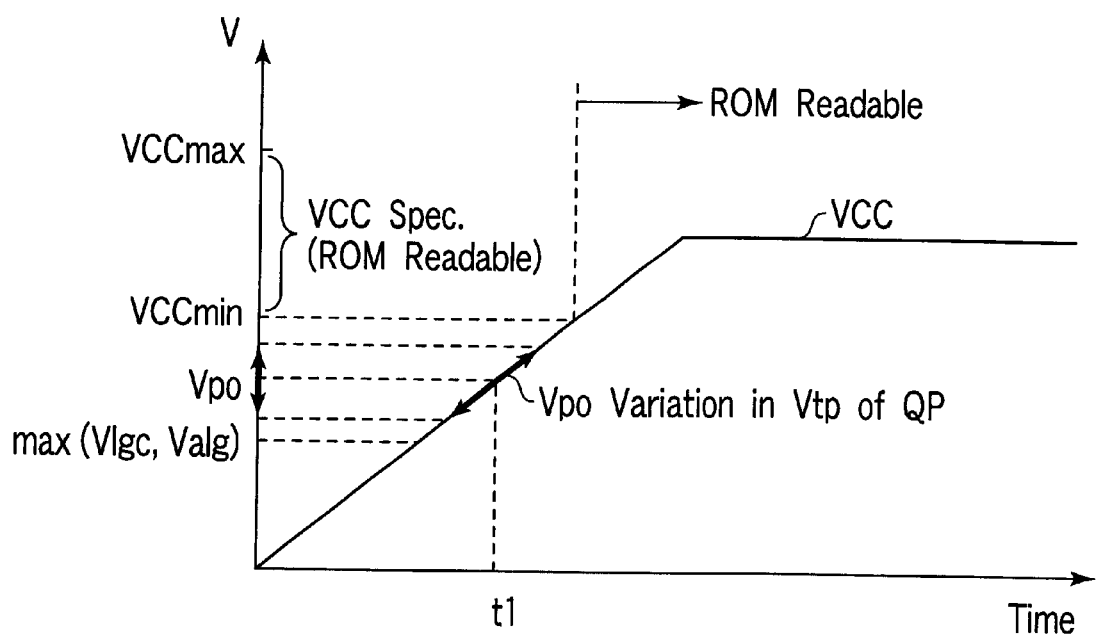

The voltage waveform chart at the time of power-on of the conventional nonvolatile semiconductor memory device is shown in FIG. 1B. This will be described again in detail with reference to FIG. 31. When the device is powered on, a power supply voltage VCC rises. When the power supply voltage VCC reaches a voltage Vlgc at which logic circuits start operating (time t0), a reference voltage circuit 309 is activated to generate reference voltage VREF. When the reference voltage VREF stabilizes, ROM read-out operation starts (time t3).

From the viewpoint of internal operation, the ROM read-out is the same as normal read-out operation. However, the ROM read-out must be executed from the power-on to the first time operated by the user. From the user side, the wait time due to the ROM read-out is preferably as short as possible. For this reason, after the power supply voltage VCC has reached the voltage Vlgc, generation of the reference voltage VREF and the ROM read-out must be sequentially executed to make the wait time until the first operated time as short as possible.

Figure 31:
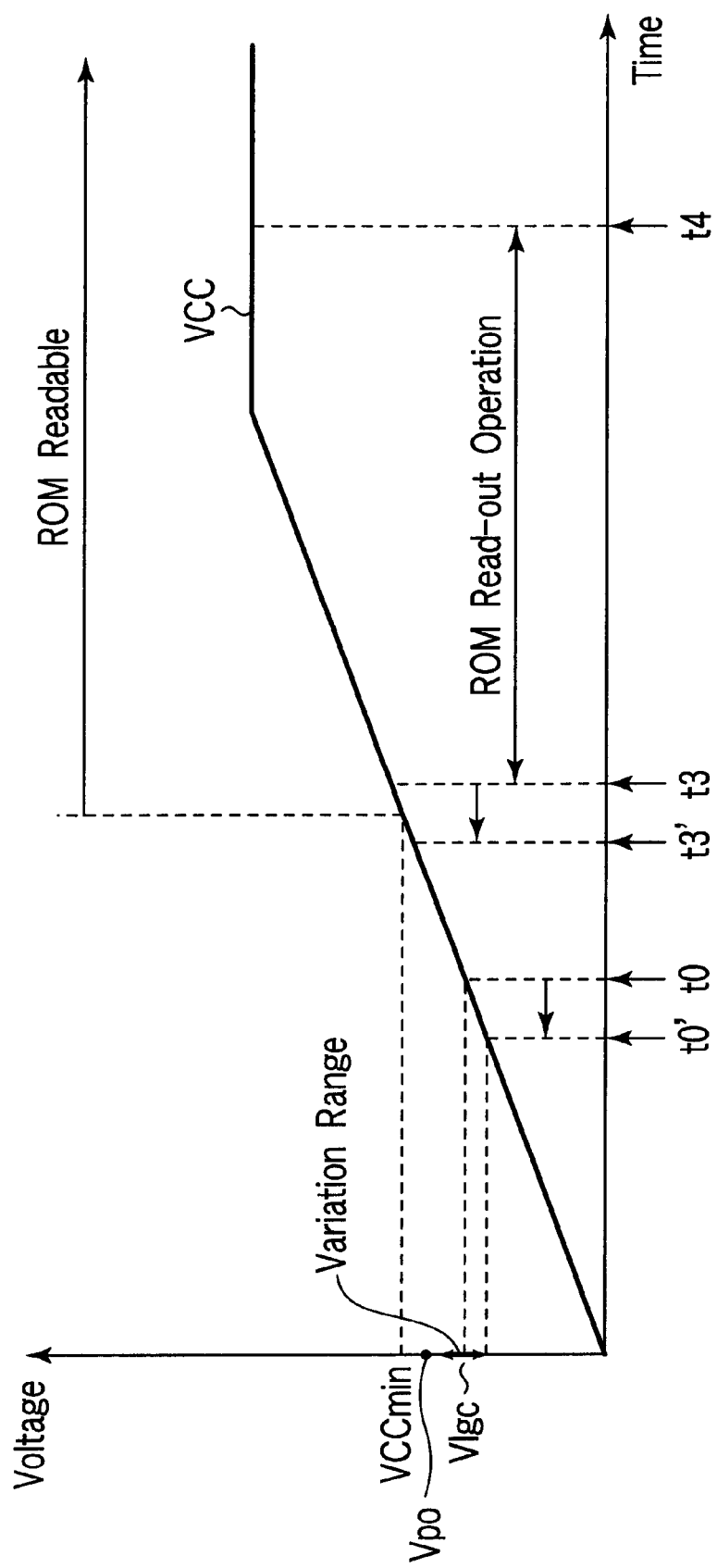
FIG. 31 is a timing chart for explaining the operation of the nonvolatile semiconductor memory device shown in FIG. 30.

The voltage Vlgc at which logic circuits start operating varies depending on conditions such as the threshold value of a transistor, as shown in FIG. 31. Assume that the voltage Vlgc varies to a low level, and the rise speed of the power supply voltage VCC is very slow. In this case, the ROM read-out operation is executed before the power supply voltage VCC sufficiently rises, unlike normal read-out operation in which the power supply voltage VCC according to the specification is supplied.

Generally, to prevent power-on reset within the specification of the power supply voltage VCC, a monitoring level Vpo of a power-on level monitor (and also the voltage Vlgc) is set to a voltage lower than VCCmin. For this reason, the ROM read-out operation may be executed while the voltage Vlgc varies to a low level (t0' in FIG. 31), and the power supply voltage VCC hasn't sufficiently risen (t3'). For the reliability of the device, stable read-out operation must be executed even under these circumstances.

If the voltage Vlgc varies to a low level, the start of ROM read-out shifts to the low-level side of the power supply voltage VCC (t3'). At this time, if the power supply voltage VCC at a ROM read-out operation start time is close to a readable minimum power supply voltage VCCmin, the power supply voltage VCC at the ROM read-out start time (t3') that has changed in accordance with the variation in voltage Vlgc becomes lower than the voltage VCCmin.

Especially, of circuits used during the read-out operation, the reference voltage circuit or differential amplifier which executes analog operation fails and damages the reliability of the read-out operation. The ROM read-out is normally operation of reading out the address data of a defective cell or voltage setting data for correcting a variation unique to the chip. Hence, damage to the reliability of this ROM read-out means a failure of the basic operation of the chip, resulting in a problem.

When the ROM read-out operation is started after the power supply voltage VCC sufficiently rises, the wait time until the user's input is permitted becomes long, and a circuit for accurately monitoring the power supply voltage VCC even when the power supply voltage VCC is varying must be independently prepared.

As described above, a demand has arisen for a semiconductor memory device capable of stable ROM read-out even when the power-on monitoring level is set to a low level is required. In addition, a demand has also arisen for a semiconductor memory device capable of stable read-out operation even when the power supply voltage is reduced at the time of normal read-out operation.

Embodiments of the present invention which solve the above problems will be described below. In the description, the same reference numerals denote the same parts throughout the drawings.

(Third Embodiment)

Figure 32:
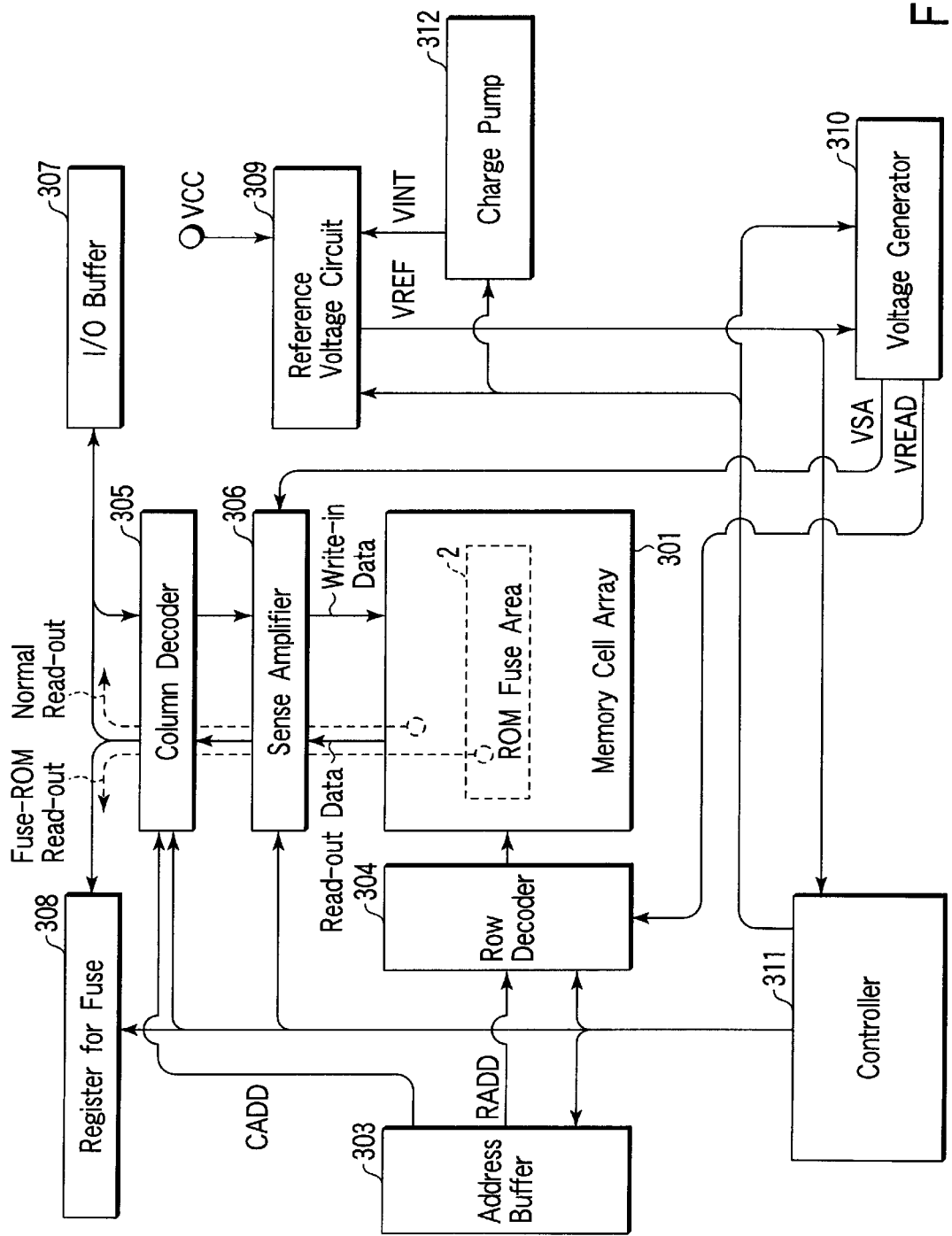
FIG. 32 is a block diagram showing the arrangement of a nonvolatile semiconductor memory device having a ROM fuse according to the third to seventh embodiments of the present invention.

FIG. 32 is a block diagram showing the basic arrangement of a nonvolatile semiconductor memory device according to the third embodiment.

As shown in FIG. 32, nonvolatile memory cells (not shown) are arrayed in a matrix in a memory cell array 301. A part of the memory cell array 301 is used as a ROM fuse area 302. Memory cells in the ROM fuse area 302 store fuse data such as the address data of defective cells in the memory cell array 301 and voltage setting data for correcting a variation unique to the chip. Each memory cell is formed from, e.g., a MOSFET with a variable threshold value, which has a floating gate and stores data in accordance with a threshold value.

An address buffer 303 outputs a row address RADD and column address CADD. The row address RADD is supplied to a row decoder 304, and the column address CADD is supplied to a column decoder 305.

The row decoder 304 selects a row of the memory cell array 301 on the basis of the received row address RADD. The column decoder 305 similarly selects a column of the memory cell array 301 on the basis of the received column address CADD.

In a data read-out, a sense amplifier 306 judges the logic of the cell data read out from the memory cell array 301 by comparing the read-out data with, e.g., a read-out reference voltage VSA, and amplifies the data. The amplified read-out data is transmitted to an I/O buffer 307 through the column decoder 305 in normal read-out operation or to a register 308 for fuse in ROM read-out. In a data write, the sense amplifier 306 takes write data from the I/O buffer 307 and writes the data to the memory cell array 301.

A reference voltage circuit 309 generates a reference voltage VREF that is used as a reference of voltage setting in the chip. The reference voltage VREF is supplied to a voltage generator 310, controller 311, and the like.

The voltage generator 310 generates various voltages to be used in the chip using the reference voltage VREF as a reference. Examples of voltages to be generated are the read-out reference voltage VSA and word line read-out voltage VREAD. The read-out reference voltage VSA is supplied to the sense amplifier 306, and the word line read-out voltage VREAD is supplied to the row decoder 304.

The controller 311 outputs a control signal for controlling the chip operation. A charge pump circuit (to be referred to as a VINT charge pump circuit hereinafter) 312 generates a charge-pumped voltage VINT from the power supply voltage VCC and supplies it to the reference voltage circuit 309.

The VINT charge pump circuit 312 in the third embodiment is activated from when the level of the power supply voltage VCC rises to the logic circuit operation start voltage Vlgc until the ROM read-out is ended.

The power supply voltage of the reference voltage circuit 309 is switched between the charge-pumped voltage VINT supplied from the charge pump circuit 312 and the power supply voltage VCC by the control signal output from the controller 311.

The operation of the nonvolatile semiconductor memory device according to the third embodiment at the time of power-on will be described next with reference to FIGS. 33 and 34.

Figure 33:
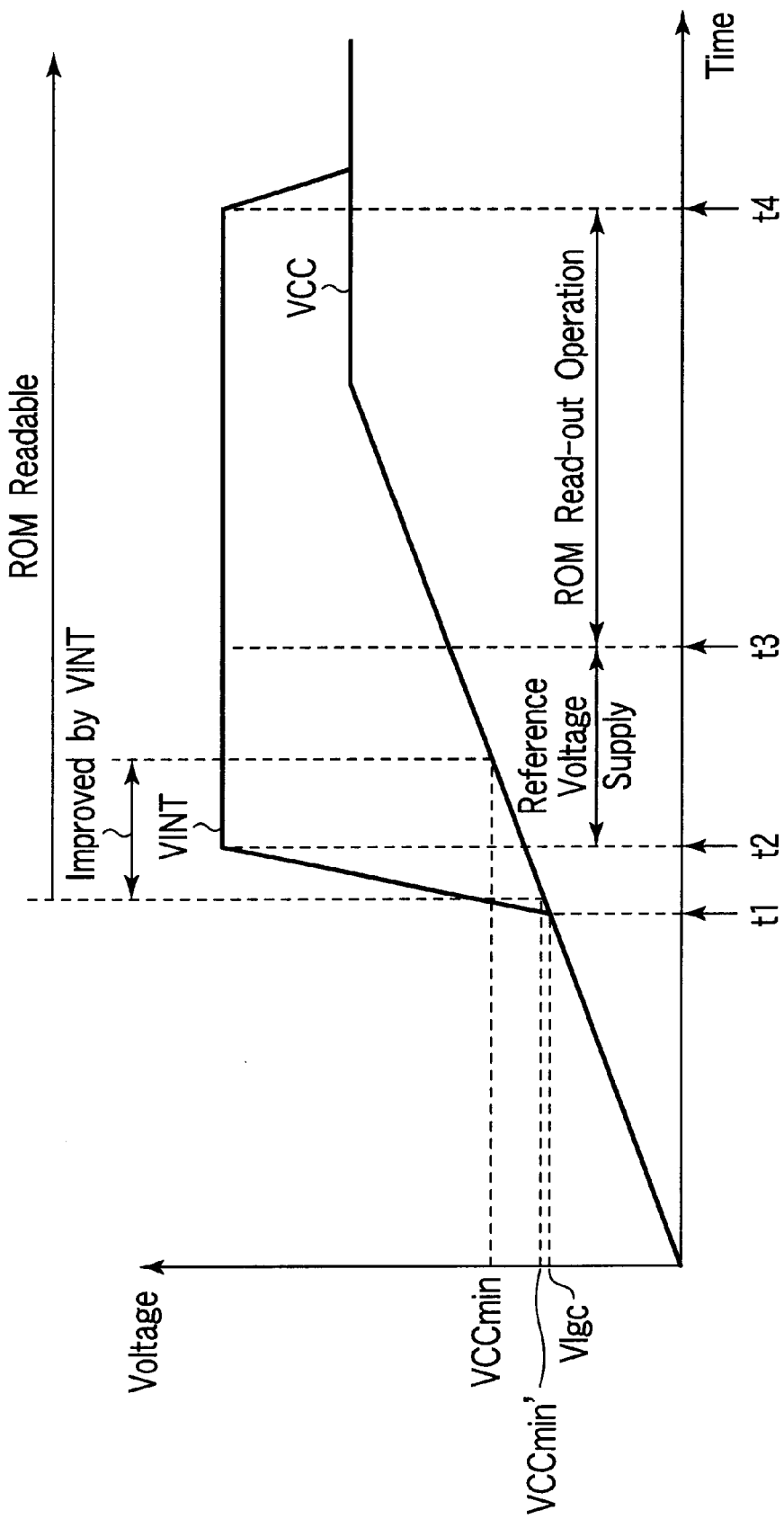
FIG. 33 is a timing chart showing the operation of the nonvolatile semiconductor memory device according to the third embodiment.

FIG. 33 is a timing chart showing the operation of the nonvolatile semiconductor memory device according to the third embodiment. FIG. 34 is a block diagram showing a power supply system which executes the operation shown in FIG. 33. FIG. 33 shows the timing chart at the time of power-on.

As shown in FIG. 33, when the power supply voltage VCC rises to the logic circuit operation start voltage Vlgc, a power-on level monitor 321 shown in FIG. 34 outputs a power-on signal PON. Upon receiving the power-on signal PON, a charge pump controller 323 outputs an activation signal OSCENB for activating an oscillator (OSC) 331 in the VINT charge pump circuit 312 and a control signal EQVCC for controlling a shorting circuit 332 in the VINT charge pump circuit 312.

Upon receiving the activation signal OSCENB, the VINT charge pump circuit 312 starts charge-pumping a charge-pump node PMPOUT to the charge-pumped voltage VINT. Simultaneously, upon receiving the control signal VCC-VINTEQL, the shorting circuit 332 disconnects the charge-pump node PMPOUT from the power supply voltage VCC (time t1).

The power-on signal PON is input to a reset terminal R of a set/reset-type flip-flop circuit (to be referred to as an SR-type F/F hereinafter) 328. Upon receiving the power-on signal PON, the SR-type F/F 328 is reset.

Next, when the charge-pumped voltage VINT rises to a predetermined level, a VINT level monitor 324 outputs a monitoring signal INTENB representing that the charge-pumped voltage VINT has reached the predetermined level. The monitoring signal INTENB is input to the charge pump controller 323 and a set terminal S of the SR-type F/F 328.

In accordance with the monitoring signal INTENB, when the level of the charge-pumped voltage VINT is equal to or higher than the predetermined level, the charge pump controller 323 stops the charge pumping operation. When the level of the charge-pumped voltage VINT is equal to or lower than the predetermined level, the charge pump controller 323 starts the charge pumping operation. With this operation, the charge-pumped voltage VINT is kept at a predetermined voltage as indicated by the period from time t2 to time t3 in FIG. 33.

Upon receiving the monitoring signal INTENB, the SR-type F/F 328 is set. The set SR-type F/F 328 outputs an activation signal REFSET for activating the reference voltage circuit 309. The SR-type F/F 328 prevents the reference voltage circuit 309 from being activated every time the monitoring signal INTENB changes.

Upon receiving the activation signal REFSET, the reference voltage circuit 309 starts generating the reference voltage VREF. The activation signal REFSET is also supplied to a timer circuit 325. Upon receiving the activation signal REFSET, the timer circuit 325 starts measuring the time until the reference voltage VREF stabilizes (time t2).

In this embodiment, time judgment is employed as a method of judging that the reference voltage VREF has stabilized. This is because while the reference voltage VREF is unstable, highly accurate judgment based on the voltage is difficult. An example of the timer circuit 325 is a delay circuit formed from an inverter and capacitor. The time set in the timer circuit 325 is almost equal to the time until the reference voltage VREF stabilizes. This time is set to, e.g., several ten $\mu$s.

When the time set in the timer circuit 325 has elapsed, the timer circuit 325 outputs a signal REFENB representing that the reference voltage VREF has stabilized. The signal REFENB is supplied to a ROM read-out controller 322. Upon receiving the signal REFENB, the ROM read-out controller 322 which has been reset by the power-on signal PON outputs a signal ROMSTART for instructing the start of ROM read-out. The signal ROMSTART is supplied to, e.g., the address buffer 303, row decoder 304, column decoder 305, sense amplifier 306, register 308 for fuse, and voltage generator 310 shown in FIG. 32. When these circuits receive the signal ROMSTART, the ROM read-out is started (time t3).

When the ROM read-out is ended, e.g., a signal ROMEND representing the end of ROM read-out is supplied to the charge pump controller 323. Upon receiving the signal ROMEND, the charge pump controller 323 ends the charge pumping operation by the VINT charge pump circuit 312 and short-circuits the charge-pump node PMPOUT to the power supply voltage VCC (time t4).

After the charge-pump node PMPOUT is short-circuited to the power supply voltage VCC, the voltage of the charge-pump node PMPOUT to which the charge-pumped voltage VINT has been supplied equals the power supply voltage VCC. From this time, the power supply voltage VCC is supplied to the power supply terminal of the reference voltage circuit 309. The operation of the nonvolatile semiconductor memory device according to the third embodiment at the time of power-on has been described above.

As described above, in the third embodiment, the VCC charge pumping operation which is used to generate a power-on reset signal free from variation in the first and second embodiments is prolonged until the ROM read-out operation is ended. As shown in FIG. 33, unlike the prior art in which the ROM read-out can be executed after the power supply voltage VCC exceeds the voltage VCCmin, the ROM read-out can be executed when the power supply voltage VCC exceeds a voltage VCCmin' because the charge-pumped voltage VINT is used.

Figure 35:
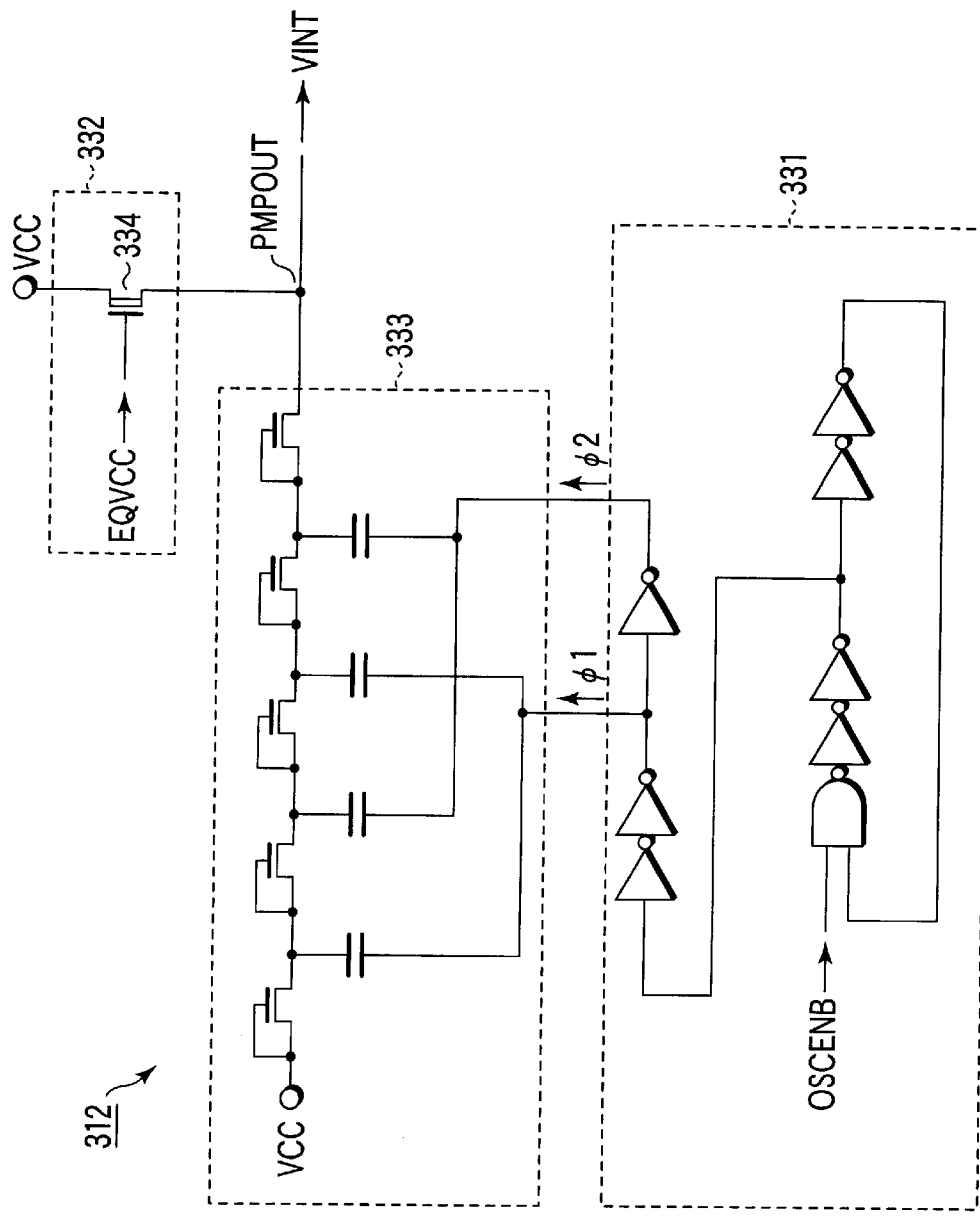
FIG. 35 is a circuit diagram showing a charge pump circuit 312 in FIG. 34.

A detailed example of the VINT charge pump circuit 312 will be described next. FIG. 35 is a circuit diagram showing the charge pump circuit 312 used in the third embodiment.

As shown in FIG. 35, the VINT charge pump circuit 312 has an oscillator 331, a shorting circuit 332 for short-circuiting the charge-pump node PMPOUT to the power supply voltage VCC, and a charge pump circuit 333.

When the activation signal OSCENB is at "HIGH" level, the oscillator 331 outputs two phase signals φ1 and φ2 in opposite phases. When the activation signal OSCENB changes from "HIGH" level to "LOW" level, oscillation is stopped.

While the two phase signals φ1 and φ2 are being oscillated, the charge pump circuit 333 generates the voltage VINT to the charge-pump node PMPOUT.

The shorting circuit 332 is formed from a depletion-type NMOS transistor 334. The control signal EQVCC is supplied to the gate of the NMOS transistor 334.

When the control signal EQVCC is at "HIGH" level, the NMOS transistor 334 short-circuits the charge-pump node PMPOUT to the power supply voltage VCC. When the control signal EQVCC is at "LOW" level, the NMOS transistor 334 cuts off and disconnects the charge-pump node PMPOUT from the power supply voltage due to the substrate bias effect. To sum up, the NMOS transistor 334 short-circuits the node from the timing when VCC=0 V to the time t1, cuts off the node after the elapse of the time t1 to the time t4, and short-circuits the node again after the elapse of the time t4.

While the charge-pump node PMPOUT is being short-circuited to the power supply voltage VCC by the NMOS transistor 334, the voltage of the charge-pump node PMPOUT is equalized to the power supply voltage VCC. Since the NMOS transistor 334 is a depletion-type NMOS transistor, the voltage of the charge-pump node PMPOUT is equalized to the power supply voltage VCC without, e.g., becoming higher than the power supply voltage VCC by the threshold value of the NMOS transistor 334.

A detailed example of the reference voltage circuit 309 will be described next. The block diagram showing the arrangement of the reference voltage circuit 309 is shown in FIG. 34.

As shown in FIG. 34, the reference voltage circuit 309 has a low-pass filter (LPF) 341, stabilizing capacitor 342, constant current circuit 343, band-gap reference circuit (BGR) 344, and level shifter 345.

The low-pass filter 341 and stabilizing capacitor 342 smooth the charge-pumped voltage VINT. The smoothed charge-pumped voltage is represented by VINT'.

The charge-pumped voltage VINT' is supplied to the constant current circuit 343, band-gap reference circuit 344, and level shifter 345.

Upon receiving the activation signal REFSET, the constant current circuit 343 is activated. As the constant current circuit 343, a known circuit, e.g., a Wilson-type constant current circuit can be used.

The power supply voltage of the constant current circuit 343 is the charge-pumped voltage VINT' from when the logic circuit operation start voltage Vlgc is monitored until the ROM read-out is ended (times t1 to t4 in FIG. 33), and becomes the power supply voltage VCC after the end of the ROM read-out. The constant current circuit 343 generates a constant current and, e.g., converts the constant current into a voltage to generate a bias voltage VBIAS. The bias voltage VBIAS is supplied to the band-gap reference circuit 344.

Upon receiving the bias voltage VBIAS and activation signal REFSET, the band-gap reference circuit 344 is activated. Like the constant current circuit 343, the band-gap reference circuit 344 can also be formed using a known circuit. For example, a differential amplifier designed to differentially receive a voltage obtained by a diode having a negative temperature coefficient and a voltage obtained by a resistor having a positive temperature coefficient and cancel the negative and positive temperature coefficients can be used.

The power supply voltage of the band-gap reference circuit 344 is the charge-pumped voltage VINT' from when the logic circuit operation start voltage Vlgc is monitored until the ROM read-out is ended (times t1 to t4 in FIG. 33), and becomes the power supply voltage VCC after the end of the ROM read-out. The band-gap reference circuit 344 outputs, e.g., a voltage VBGR close to the band-gap voltage of silicon. The voltage VBGR is supplied to the level shifter 345.

The level shifter 345 changes the voltage VBGR to the reference voltage VREF having a desired level. The level shifter 345 can also be formed using a known circuit. The level shifter 345 is arranged as needed.

The power supply voltage of the level shifter 345 is the charge-pumped voltage VINT' from when the logic circuit operation start voltage Vlgc is monitored until the ROM read-out is ended (times t1 to t4 in FIG. 33), and becomes the power supply voltage VCC after the end of the ROM read-out. The reference voltage VREF is supplied to, e.g., the voltage generator 310 and the like, as shown in FIG. 32.

The effects of the nonvolatile semiconductor memory device according to the third embodiment will be described next. As shown in FIG. 31, in the conventional device, a boundary defining the range of the readable power supply voltage is present near the ROM read-out start time t3. For this reason, if the rise of the power supply voltage VCC is slow, and the logic circuit operation start voltage Vlgc varies to the lower side, the ROM read-out start time t3 may shift to the lower side of the power supply voltage VCC and deviate from the readable range.

However, the lower limit value (VCCmin) of the readable power supply voltage is determined by analog circuits such as the reference voltage circuit and differential amplifier. When these circuits are excluded from consideration, the lower limit value of the readable power supply voltage can be made smaller.

In the third embodiment, the power supply voltage for analog circuits such as the reference voltage circuit and differential amplifier is set to the charge-pumped voltage VINT'. With this arrangement, the lower limit value of the readable power supply voltage, which is conventionally present near the time t3 when the ROM read-out starts, can be shifted in the direction from the time t2 to t1, i.e., to the lower side of the power supply voltage VCC, as shown in FIG. 33. Hence, the range of the readable power supply voltage can be extended to the lower side of the power supply voltage VCC.

According to this third embodiment, for example, the following effects can be obtained.

(1) Even when the power-on monitoring level varies to the lower side, ROM read-out can be reliably executed.

(2) As compared to the conventional device, the ROM read-out start time t3 can be put forward, and the wait time until the user input is permitted can be shortened.

(3) As compared to the conventional device, a margin can easily be ensured for the requirement of lower power supply voltage.

(Fourth Embodiment)

Figure 36:
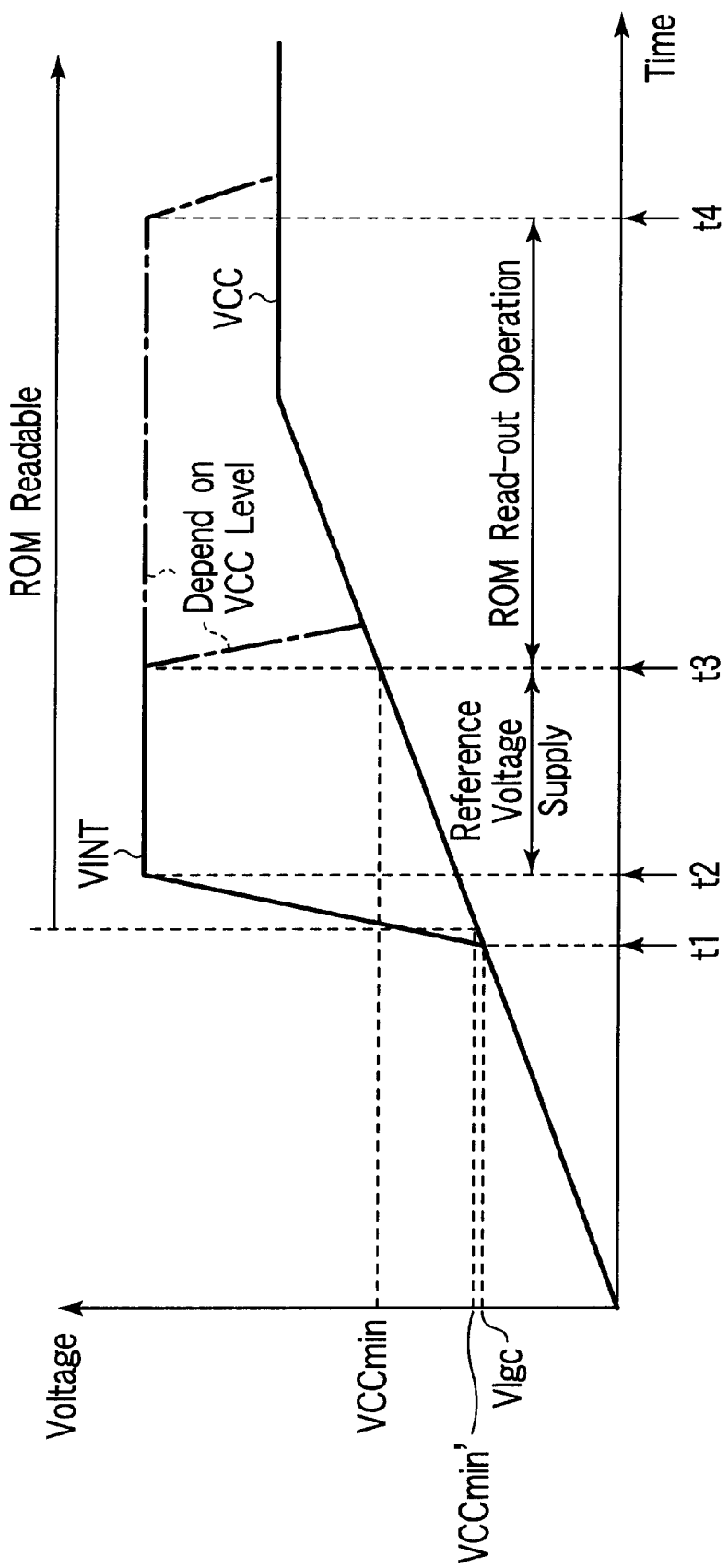
FIG. 36 is a timing chart showing the operation of the nonvolatile semiconductor memory device according to the fourth embodiment.
Figure 37:
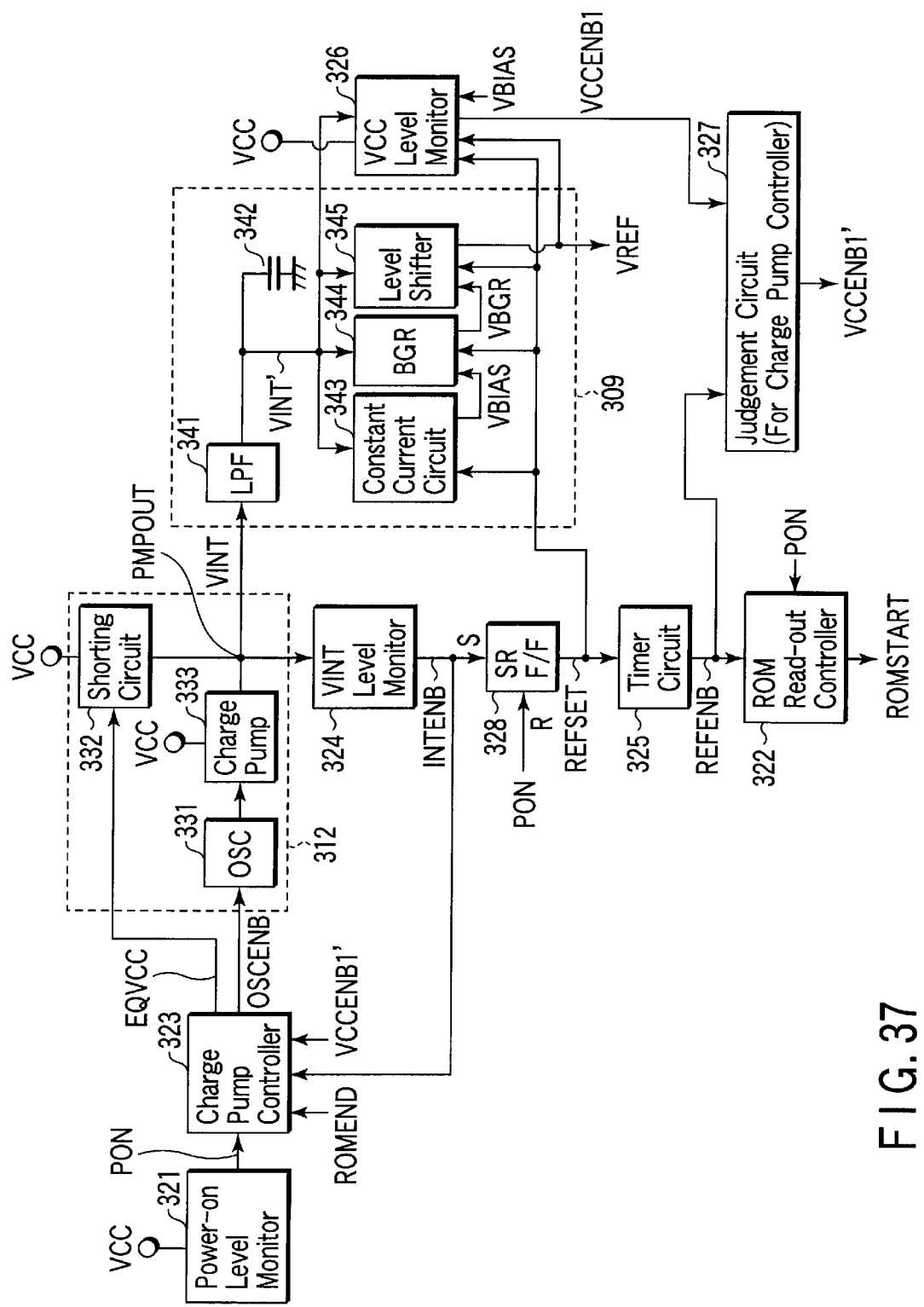
FIG. 37 is a block diagram showing the power supply system of the nonvolatile semiconductor memory device which executes the operation shown in FIG. 36.

FIG. 36 is a timing chart showing the operation of a nonvolatile semiconductor memory device according to the fourth embodiment. FIG. 37 is a block diagram showing the power supply system which executes the operation shown in FIG. 36. FIG. 36 shows the timing chart at the time of power-on.

The fourth embodiment is different from the third embodiment in that after time t3 when a reference voltage VREF stabilizes, a power supply voltage VCC is monitored using the stable reference voltage VREF. In the present invention, a reference voltage circuit 309 is operated by a charge-pumped voltage VINT. For this reason, the reference voltage VREF at the time t3 is an accurate voltage with little variation. Hence, when the power supply voltage VCC is monitored after the time t3, the level of the power supply voltage VCC can be accurately known.

In the fourth embodiment, using the above fact, it is determined after the time t3 whether the level of the power supply voltage VCC rises within the range of the readable power supply voltage. If the power supply voltage level rises within that range, a charge-pump node PMPOUT to which the charge-pumped voltage VINT is supplied is short-circuited to the power supply voltage VCC so that VINT=VCC.

Conversely, if the level of the power supply voltage VCC falls in the underside of the lower limit of the readable power supply voltage, charge pumping is continued.

According to the fourth embodiment, in addition to the effects of the third embodiment, an effect of suppressing power consumption in a ROM read-out can be obtained.

The operation of the nonvolatile semiconductor memory device according to the fourth embodiment at the time of power-on will be described next in more detail with reference to FIGS. 36 and 37.

As shown in FIG. 36, operation until time t2 is basically the same as in the third embodiment. When the charge-pumped voltage VINT rises to a predetermined level, a VINT level monitor 324 outputs a monitoring signal INTENB, and an SR-type F/F 328 outputs an activation signal REFSET for activating a reference voltage circuit 309. In this embodiment, the activation signal REFSET is supplied not only to the reference voltage circuit 309 and timer circuit 325 but also to a VCC level monitor 326.

Upon receiving the activation signal REFSET, the reference voltage circuit 309 starts generating the reference voltage VREF, as in the third embodiment. Upon receiving the activation signal REFSET, the timer circuit 325 also starts measuring the time until the reference voltage VREF stabilizes, as in the third embodiment.

When the power supply voltage VCC reaches a predetermined level, the VCC level monitor 326 outputs a signal VCCENB1. In this embodiment, the predetermined level is the lower limit value of the readable power supply voltage. When the level of the power supply voltage VCC is equal to or more than the lower limit value, the VCC level monitor 326 outputs the signal VCCENB1 (time t2).

When the time set in the timer circuit 325 has elapsed, the timer circuit 325 outputs a signal REFENB representing that the reference voltage VREF has stabilized. The signal REFENB is supplied to a ROM read-out controller 322 and judgment circuit (for charge pump controller) 327. Upon receiving the signal REFENB, the ROM read-out controller 322 which has been reset by a power-on signal PON outputs a signal ROMSTART for instructing the start of ROM read-out, as in the third embodiment.

The judgment circuit 327 receives the signal REFENB and the signal VCCENB1 from the VCC level monitor 326 and outputs a signal VCCENB1' to a charge pump controller 323 (time t3).

When the ROM read-out is ended, for example, a signal ROMEND representing the end of the ROM read-out is supplied to the charge pump controller 323. Upon receiving the signal VCCENB1' and signal ROMEND, when the level of the power supply voltage VCC is equal to or more than a lower limit value VCCmin of the readable power supply voltage (the signal VCCENB1' is active) or when the ROM read-out is ended (the signal ROMEND is active), the charge pump controller 323 ends the charge pumping operation by a VINT charge pump circuit 312 and short-circuits the charge-pump node PMPOUT to the power supply voltage VCC (time t4).

The subsequent operation is the same as in the third embodiment.

Figure 38:
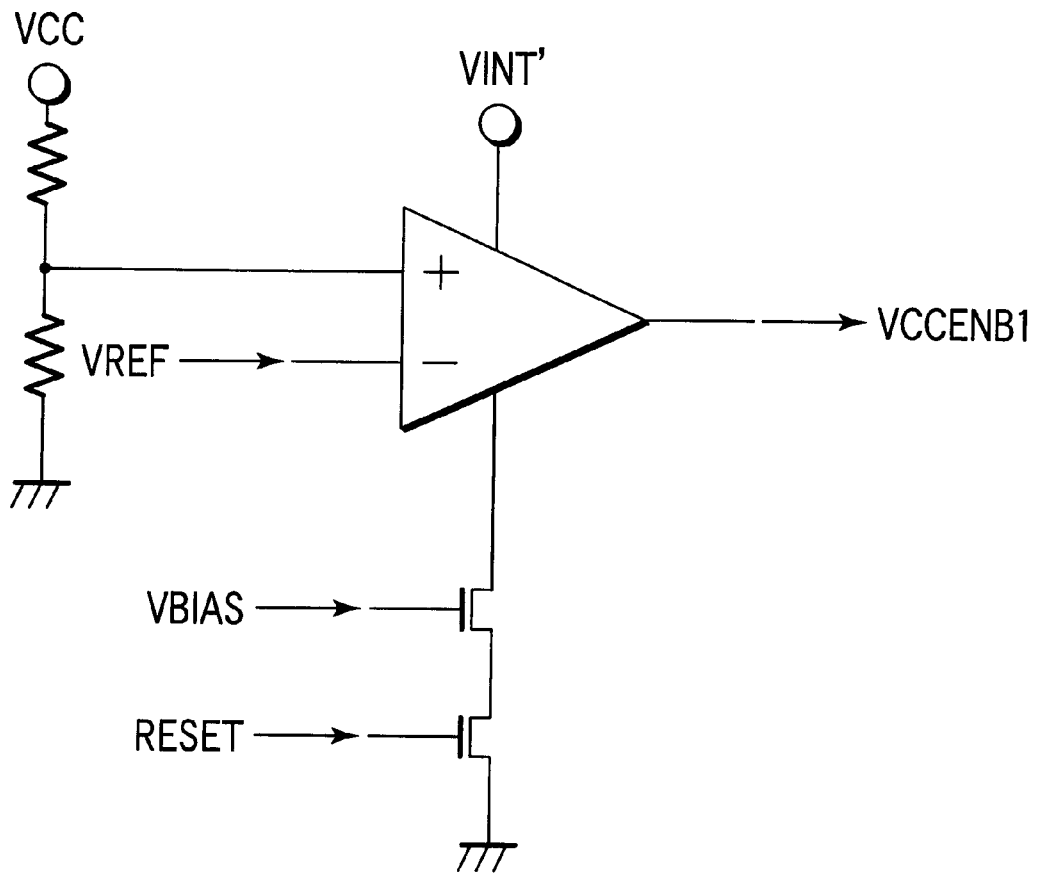
FIG. 38 is a circuit diagram showing a VCC level monitor 326 in FIG. 37.

A detailed example of the VCC level monitor 326 will be described next. FIG. 38 is a circuit diagram showing the arrangement of the VCC level monitor 326.

As shown in FIG. 38, the VCC level monitor 326 is activated upon receiving the activation signal REFSET. As the VCC level monitor 326, a known circuit can be used. For example, a differential amplifier designed to differentially receive a voltage obtained by resistance-dividing the power supply voltage VCC and the reference voltage VREF and monitor whether the power supply voltage VCC has reached the desired predetermined level can be used.

The power supply voltage of the reference voltage circuit 309 of this embodiment and the power supply voltage of the VCC level monitor 326 are the charge-pumped voltage VINT' from when a logic circuit operation start voltage Vlgc is monitored until the level of the power supply voltage VCC becomes equal to or more than the lower limit value VCCmin of the readable power supply voltage (times t1 to t3 in FIG. 36) or until the ROM read-out is ended (times t1 to t4 in FIG. 36), and becomes the power supply voltage VCC after the end of the ROM read-out.

(Fifth Embodiment)

FIG. 39 is a timing chart showing the operation of a nonvolatile semiconductor memory device according to the fifth embodiment. FIG. 40 is a block diagram showing the power supply system which executes the operation shown in FIG. 39. FIG. 39 shows the timing chart at the time of power-on.

The fifth embodiment is different from the third embodiment in that after time t3 when a reference voltage VREF stabilizes, a power-on monitoring level is monitored using the stable reference voltage VREF. A ROM read-out is started immediately after the power-on level is monitored. For this reason, the power-on monitoring level in this embodiment is preferably set to a lower limit value VCCmin of the readable power supply voltage.

According to the fifth embodiment, in addition to the effects of the third embodiment, a variation in power-on monitoring level (the logic circuit operation start voltage in the third embodiment) can be reduced.

The operation of the nonvolatile semiconductor memory device according to the fifth embodiment at the time of power-on will be described next in more detail with reference to FIGS. 39 and 40.

As shown in FIG. 39, when a power supply voltage VCC rises to a logic circuit operation start voltage (Vlgc), a charge pump start level monitor 351 shown in FIG. 40 outputs a charge pump reset signal PONINT. Upon receiving the charge pump reset signal PONINT, a charge pump controller 323 outputs an activation signal OSCENB for activating an oscillator (OSC) 331 in a VINT charge pump circuit 312 and a control signal EQVCC for controlling a shorting circuit 332 in the VINT charge pump circuit 312.

The VINT charge pump circuit 312 starts operation of charge-pumping a node PMPOUT to a voltage VINT upon receiving the activation signal OSCENB, and also disconnects the charge-pump node PMPOUT from the power supply voltage VCC upon receiving the control signal EQVCC (time t1).

The charge pump reset signal PONINT is input to a reset terminal R of an SR-type F/F 328. Upon receiving the charge pump reset signal PONINT, the SR-type F/F 328 is reset.

Next, when the charge-pumped voltage VINT rises to a predetermined level, a VINT level monitor 324 outputs a monitoring signal INTENB representing that the charge-pumped voltage VINT has reached the predetermined level. The monitoring signal INTENB is input to a charge pump controller 323 and a set terminal S of the SR-type F/F 328. Upon receiving the monitoring signal INTENB, the charge pump controller 323 performs operation of keeping the charge-pumped voltage VINT at a predetermined voltage, as described in the third embodiment.

Upon receiving the monitoring signal INTENB, the SR-type F/F 328 is set. The set SR-type F/F 328 outputs an activation signal REFSET for activating the reference voltage circuit 309.

In this embodiment, the activation signal REFSET is supplied not only to the reference voltage circuit 309 and timer circuit 325 but also to a power-on level monitor 352. Upon receiving the activation signal REFSET, the reference voltage circuit 309 starts generating the reference voltage VREF, as in the third embodiment. Upon receiving the activation signal REFSET, the timer circuit 325 also starts measuring the time until the reference voltage VREF stabilizes, as in the third embodiment.

When the power supply voltage VCC reaches a predetermined level, the power-on level monitor 352 outputs a signal VCCENB2. In this embodiment, the predetermined level is the power-on monitoring level. When the level of the power supply voltage VCC is equal to or more than the power-on monitoring level, the power-on level monitor 352 outputs the signal VCCENB2 (time t2).

When the time set in the timer circuit 325 has elapsed, the timer circuit 325 outputs a signal REFENB representing that the reference voltage VREF has stabilized. The signal REFENB is supplied to a judgment circuit (power-on reset circuit) 353. Upon receiving the signal REFENB and the signal VCCENB2 from the power-on level monitor 352, the judgment circuit 353 outputs a power-on reset signal PON. The power-on reset signal PON is supplied to a read-out controller 322 (time t3).

Upon receiving the power-on reset signal PON, the ROM read-out controller 322 outputs a signal ROMSTART for instructing the start of ROM read-out (time t3').

When the ROM read-out is ended, for example, a signal ROMEND representing the end of the ROM read-out is supplied to the charge pump controller 323. The charge pump controller 323 ends the charge pumping operation by the VINT charge pump circuit 312 and short-circuits the charge-pump node PMPOUT to the power supply voltage VCC (time t4).

The subsequent operation is the same as in the third embodiment.

The power-on level monitor 352 can be formed from the same circuit as, e.g., the VCC level monitor 326 described in the fourth embodiment.

The power supply voltage of the reference voltage circuit 309 of this embodiment and the power supply voltage of the VCC level monitor 326 are the charge-pumped voltage VINT from when the charge pump start level is monitored until the ROM read-out is ended (times t1 to t4 in FIG. 39), and becomes the power supply voltage VCC after the end of the ROM read-out.

(Sixth Embodiment)

Figure 41:
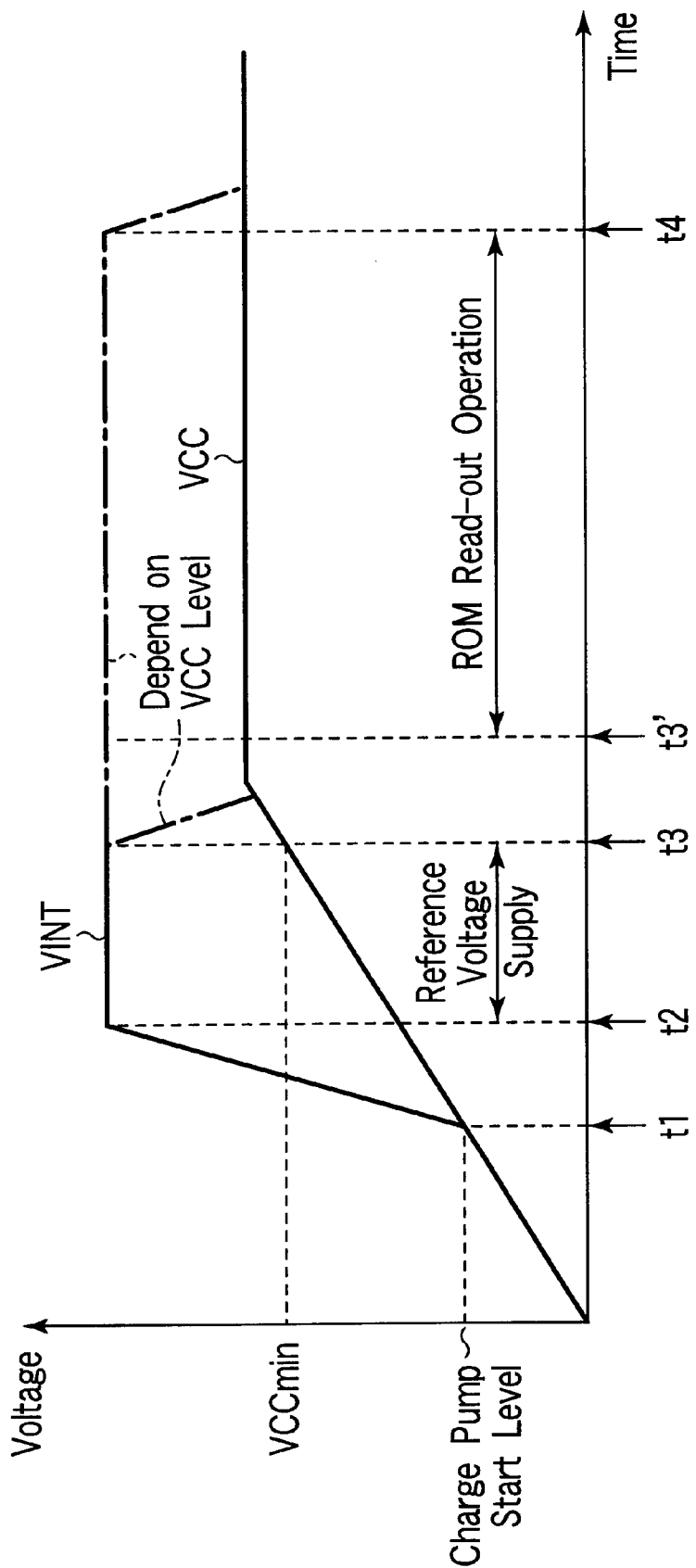
FIG. 41 is a timing chart showing the operation of the nonvolatile semiconductor memory device according to the sixth embodiment.
Figure 42:
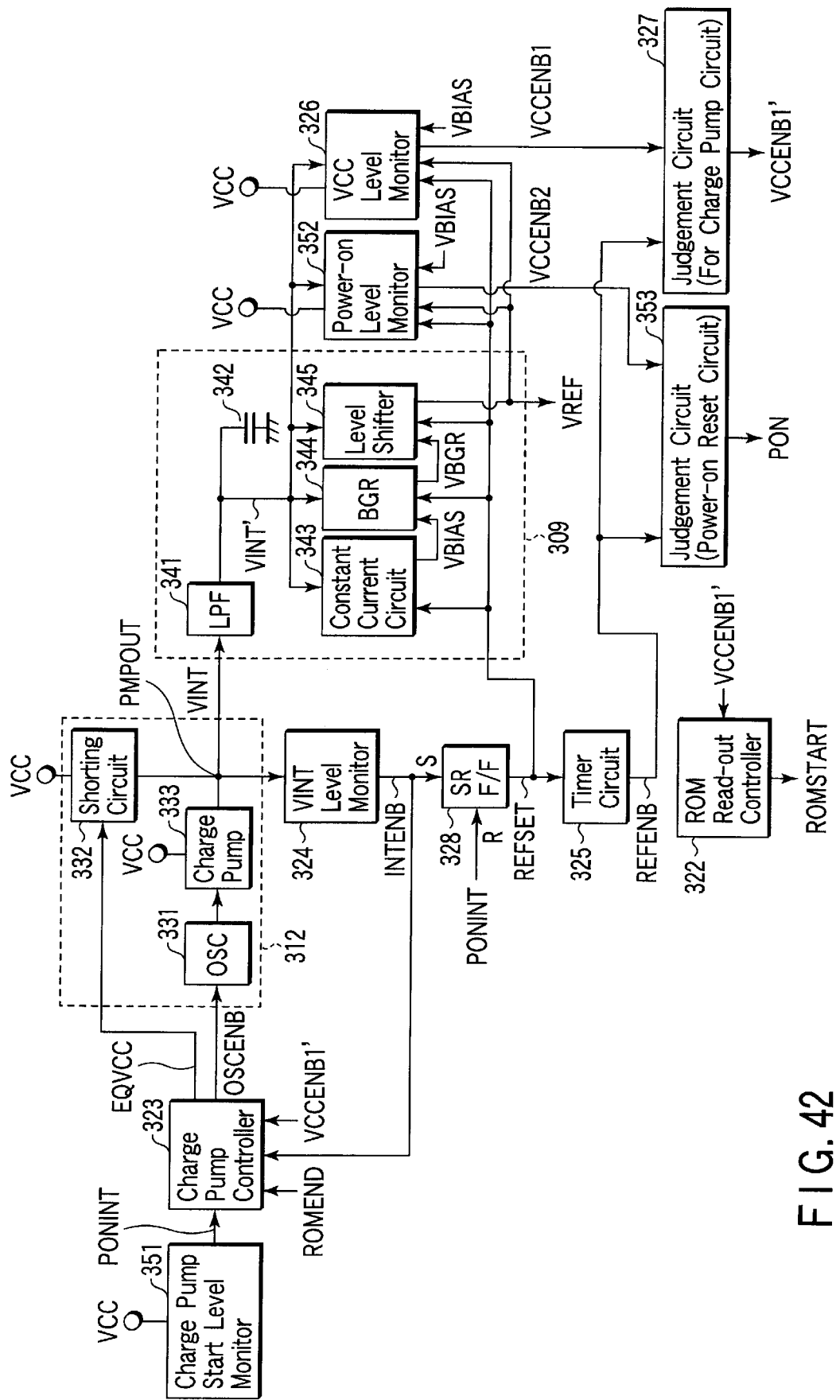
FIG. 42 is a block diagram showing the power supply system of the nonvolatile semiconductor memory device which executes the operation shown in FIG. 41.

FIG. 41 is a timing chart showing the operation of a nonvolatile semiconductor memory device according to the sixth embodiment. FIG. 42 is a block diagram showing the power supply system which executes the operation shown in FIG. 41. FIG. 41 shows the timing chart at the time of power-on.

The sixth embodiment is different from the fifth embodiment in that after time t3 when a reference voltage VREF stabilizes, it is determined whether the level of a power supply voltage VCC rises within the range of the readable power supply voltage, and if the power supply voltage level rises within that range, a charge-pump node PMPOUT to which a charge-pumped voltage VINT is supplied is short-circuited to the power supply voltage VCC so that VINT= VCC.

According to the sixth embodiment, in addition to the effects of the fifth embodiment, an effect of suppressing power consumption in ROM read-out can be obtained.

The operation of the nonvolatile semiconductor memory device according to the sixth embodiment at the time of power-on will be described next in more detail with reference to FIGS. 41 and 42.

As shown in FIG. 41, operation until time t2 is basically the same as in the fifth embodiment. When the charge-pumped voltage VINT rises to a predetermined level, a VINT level monitor 324 outputs a monitoring signal INTENB, and an SR-type F/F 328 outputs an activation signal REFSET for activating a reference voltage circuit 309. In this embodiment, the activation signal REFSET is supplied not only to the reference voltage circuit 309 and timer circuit 325 but also to power-on level monitor 352 and VCC level monitor 326. Upon receiving the activation signal REFSET, the reference voltage circuit 309 starts generating the reference voltage VREF, as in the third embodiment. Upon receiving the activation signal REFSET, the timer circuit 325 also starts measuring the time until the reference voltage VREF stabilizes, as in the third embodiment. When the power supply voltage VCC reaches a predetermined level, the power-on level monitor 352 outputs a signal VCCENB2. In this embodiment, the predetermined level is the power-on monitoring level. When the level of the power supply voltage VCC is equal to or more than the power-on level, the power-on level monitor 352 outputs the signal VCCENB2. When the power supply voltage VCC reaches the predetermined level, the VCC level monitor 326 outputs a signal VCCENB1. The predetermined level in the VCC level monitor 326 is a lower limit value VCCmin of the readable power supply voltage. When the level of the power supply voltage VCC is equal to or more than the lower limit value, the VCC level monitor 326 outputs the signal VCCENB1 (time t2).

When the time set in the timer circuit 325 has elapsed, the timer circuit 325 outputs a signal REFENB representing that the reference voltage VREF has stabilized. The signal REFENB is supplied to a judgment circuit (power-on reset circuit) 353 and judgment circuit (for charge pump controller) 327. Upon receiving the signal REFENB and the signal VCCENB2 from the power-on level monitor 352, the judgment circuit 353 outputs a power-on reset signal POR. Upon receiving the signal REFENB and the signal VCCENB1 from the VCC level monitor 326, the judgment circuit 327 outputs a signal VCCENB1'. The signal VCCENB1' is supplied to a ROM read-out controller 322 and charge pump controller 323 (time t3).

Upon receiving the signal VCCENB1', the read-out controller 322 outputs a signal ROMSTART for instructing the start of ROM read-out (time t3').

When the ROM read-out is ended, for example, a signal ROMEND representing the end of the ROM read-out is supplied to the charge pump controller 323. Upon receiving the signal VCCENB1' and signal ROMEND, when the level of the power supply voltage VCC is equal to or more than the lower limit value of the readable power supply voltage (the signal VCCENB1' is active) or when the ROM read-out is ended (the signal ROMEND is active), the charge pump controller 323 ends the charge pumping operation by a VINT charge pump circuit 312 and short-circuits the charge-pump node PMPOUT to the power supply voltage VCC (time t4).

The subsequent operation is the same as in the third embodiment.

The power supply voltage of the reference voltage circuit 309 of this embodiment, the power supply voltage of the power-on level monitor 352, and the power supply voltage of the VCC level monitor 326 are the charge-pumped voltage VINT' from when the charge pump start level is monitored until the level of the power supply voltage VCC becomes equal to or more than the lower limit value VCCmin of the readable power supply voltage (times t1 to t3 in FIG. 41) or until the ROM read-out is ended (times t1 to t4 in FIG. 41), and becomes the power supply voltage VCC after the end of the ROM read-out.

(Seventh Embodiment)

As the main characteristic feature of the seventh embodiment, when the level of a power supply voltage VCC becomes lower than a lower limit value VCCmin of a readable power supply voltage which is determined by analog circuits such as a reference voltage circuit and differential amplifier, the power supply voltage for the analog circuits such as the reference voltage circuit and differential amplifier is charge-pumped.

This main characteristic feature can be applied not only to a ROM read-out as described above in the third to sixth embodiments but also to a normal read-out.

Especially, the present invention can be effectively applied to a nonvolatile semiconductor memory device whose specifications are designed to make the power supply voltage lower in a normal read-out than in other operation modes. Such a nonvolatile semiconductor memory device is disclosed in Japanese Patent Application No. 11-366763.

An example in which the present invention is applied to such a nonvolatile semiconductor memory device will be described below as the seventh embodiment.

FIG. 43 is a timing chart showing the operation of the nonvolatile semiconductor memory device according to the seventh embodiment of the present invention. FIG. 43 shows the timing chart in a normal read-out.

As shown in FIG. 43, at time t11, a charge pump circuit 312 for a reference voltage circuit/differential amplifier is operated to charge-pump the power supply voltage for analog circuits such as the reference voltage circuit and differential amplifier from the power supply voltage VCC to a charge-pumped voltage VINT. After that, the power supply voltage for circuits other than the analog circuits such as the reference voltage circuit and differential amplifier is reduced from the power supply voltage VCC to VCC'.

Between times t12 and t13, normal read-out operation is executed. After that, the power supply voltage VCC' for the circuits other than the analog circuits such as the reference voltage circuit and differential amplifier is restored to the power supply voltage VCC.

At time t14, the charge pump circuit 312 is stopped to restore the power supply voltage for the analog circuits such as the reference voltage circuit and differential amplifier from the charge-pumped voltage VINT to the power supply voltage VCC.

In a nonvolatile semiconductor memory device whose specifications are designed to make the power supply voltage lower in a normal read-out than in other operation modes, the power supply voltage in the normal read-out may be less than the lower limit value VCCmin of a readable power supply voltage determined by analog circuits such as a reference voltage circuit and differential amplifier. If the power supply voltage becomes less than the lower limit value, normal read-out operation can hardly be stably executed.

However, according to this embodiment, even when the power supply voltage VCC' is made less than the lower limit value VCCmin of the readable power supply voltage for the analog circuits such as the reference voltage circuit and differential amplifier, normal read-out operation can be stably executed. That is, between the times t12 and t13, the lower limit value VCCmin can be locally decreased.

The present invention described by the third to seventh embodiments is not limited to these embodiments. For example, in each of the above embodiments, the present invention is applied to a nonvolatile semiconductor memory device. However, the present invention can be applied not only to a nonvolatile semiconductor memory device but also to a semiconductor memory device other than a nonvolatile semiconductor memory device.

The above embodiments can be practiced standalone or appropriately combined. The above embodiments incorporate various stages of the invention, so various stages of the invention can be extracted by appropriately combining a plurality of components disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
an oscillator which starts generating a clock pulse when a power supply voltage supplied from an outside of the semiconductor device becomes higher than a first voltage;
a charge pump circuit configured to execute charge pumping operation upon receiving said clock pulse;
a voltage monitor configured to generate a power-on reset signal upon receiving an output voltage from said charge pump circuit;
an internal power supply terminal configured to supply said power supply voltage as an internal power supply voltage, and
a reference voltage generator configured to generate a reference voltage using said output voltage from said charge pump circuit as a power supply,
said voltage monitor using said output voltage from said charge pump circuit as a power supply, having a comparator configured to compare a divided voltage of said internal power supply voltage with said reference voltage, and when said internal power supply voltage is higher than a second voltage, outputting a first signal of a first logic level as said power-on reset signal.

2. A semiconductor device comprising:
an oscillator which starts generating a clock pulse when a power supply voltage supplied from an outside of the semiconductor device becomes higher than a first voltage:
   a charge pump circuit configured to execute charge pumping operation upon receiving said clock pulse;
   a voltage monitor configured to generate a power-on reset signal upon receiving an output voltage from said charge pump circuit;
   a voltage down converter configured to convert said power supply voltage into an internal power supply voltage, and
a reference voltage generator configured to generate a reference voltage using said output voltage from said charge pump circuit as a power supply,
   wherein said voltage monitor uses said output voltage from said charge pump circuit as a power supply, has a comparator configured to compare a divided voltage of said internal power supply voltage with said reference voltage, and when said internal power supply voltage is higher than a second voltage, outputs a first signal of a first logic level as said power-on reset signal.

3. The device according to claim 1, wherein said charge pump circuit comprises a charge pump circuit section, a low-pass filter connected to an output side of said charge pump circuit section, and a capacitor configured to stabilize a charge-pumped voltage.

4. The device according to claim 1,
further comprising a logic circuit, wherein said first voltage is a voltage at which said logic circuit starts operating.

5. The device according to claim 1, wherein said oscillator uses the power supply voltage as a power supply and is formed as a ring oscillator formed by connecting a substantially odd number of inverters in series.

6. The device according to claim 1, wherein oscillation operation of the oscillator is enabled upon receiving a signal representing that it is monitored that said power supply voltage becomes higher than said first voltage.

7. The device according to claim 1, further comprising a current source generator which uses said output voltage from said charge pump circuit as a power supply.

8. The device according to claim 1, further comprising a first charge-pumped voltage monitor configured to determine whether the output voltage from the charge pump circuit is higher or lower than a third voltage, and when said first charge-pumped voltage monitor determines that said output voltage from said charge pump circuit is lower than said third voltage, said first charge-pumped voltage monitor suppressing said first signal from changing to a first logic level independently of whether said internal power supply voltage is higher or lower than said second voltage.

9. The device according to claim 8, wherein said first charge-pumped voltage monitor suppresses said first signal from changing to said first logic level independently of whether said internal power supply voltage is higher or lower than said second voltage until an elapse of a first time that is required from a timing when said output voltage from said charge pump circuit becomes higher than said third voltage to a timing when said reference voltage generator and said voltage monitor are set in an operative state.

10. The device according to claim 1, further comprising a limiter configured to limit the output voltage from said charge pump circuit.

11. The device according to claim 10, wherein said limiter comprises diode-connected MOS transistors inserted between said output voltage from said charge pump circuit and said power supply voltage.

12. The device according to claim 10, wherein said limiter comprises diode-connected MOS transistors inserted between said output voltage from said charge pump circuit and a ground potential.

13. The device according to claim 10, wherein said limiter comprises a second charge-pumped voltage monitor configured to compare a divided voltage of said output voltage from said charge pump circuit with said reference voltage and outputting a second signal, said second charge-pumped voltage monitor having a first monitoring level and a second monitoring level higher than said first monitoring level from when said divided voltage of said output voltage from said charge pump circuit becomes higher than said second monitoring level until said output voltage from said charge pump circuit drops and becomes lower than said first monitoring level, changing said second signal to said first logic level, and otherwise, keeping said second signal at a second logic level, and
   when said second signal is at said first logic level, the oscillator forcibly stops generating said clock pulse.

14. The device according to claim 1, wherein when said first signal is at said first logic level, generation of said clock pulse by said oscillator is forcibly stopped, and terminals of an output of said charge pump circuit and said power supply voltage are short-circuited.

15. The device according to claim 14, further comprising a flag fixing circuit configured to execute control so that an output node of said charge pump circuit and said power supply voltage are short-circuited after a delay of a fixed time that is substantially equal to a time required until reference voltage generation operation by said reference voltage generator stabilizes since when a flag signal changes to said first logic level upon monitoring a rise of the internal power supply voltage by said voltage monitor.

16. The device according to claim 15, wherein said flag fixing circuit comprises a first NAND circuit whose one input terminal receives said flag signal, a second NAND circuit whose one input terminal receives an output from said first NAND circuit, a first inverter fro receiving an output from said second NAND circuit, a delay circuit configured to delay a signal from said first inverter by a predetermined time, a third NAND circuit whose one input terminal receives an output from said delay circuit, whose other input terminal receives said output from said second NAND circuit, and whose output terminal is connected to the other input terminal of said second NAND circuit, a NOR circuit whose one input terminal receives said output from said delay circuit and whose other input terminal receives said output from said second NAND circuit, and a second inverter whose input terminal receives an output from said NOR circuit and whose output terminal is connected to the other input terminal of said first NAND circuit.

17. A semiconductor device comprising:
   an internal power supply terminal configured to supply an externally supplied power supply voltage as an internal power supply voltage;
   a reference voltage generator configured to generate a reference voltage from said internal power supply voltage;
   a power-on reset circuit; and
   a peripheral circuit other than said power-on reset circuit,
   wherein after said reference voltage is generated, power-on reset operation of resetting said peripheral circuit other than said power-on reset circuit is executed.

18. The device according to claim 1, wherein said oscillator stops oscillation operation thereof upon receiving said power-on reset signal.

* * * * *